(12) United States Patent
Lukas et al.

(10) Patent No.: US 7,470,454 B2
(45) Date of Patent: *Dec. 30, 2008

(54) NON-THERMAL PROCESS FOR FORMING POROUS LOW DIELECTRIC CONSTANT FILMS

(75) Inventors: Aaron Scott Lukas, Lansdale, PA (US); Mark Leonard O'Neill, Allentown, PA (US); Mark Daniel Bitner, Nazareth, PA (US); Jean Louise Vincent, Bethlehem, PA (US); Raymond Nicholas Vrtis, Allentown, PA (US); Eugene Joseph Karwacki, Jr., Orefield, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/624,356

(22) Filed: Jul. 21, 2003

(65) Prior Publication Data

US 2004/0096593 A1    May 20, 2004

Related U.S. Application Data

(63) Continuation-in-part of application No. 10/295,568, filed on Nov. 14, 2002, now Pat. No. 7,404,990.

(51) Int. Cl.
*B05D 5/00* (2006.01)
*B05D 3/06* (2006.01)
*B05D 3/02* (2006.01)
*C23C 16/18* (2006.01)
*C23C 16/40* (2006.01)
*C23C 16/42* (2006.01)
*C23C 16/48* (2006.01)
*C23C 16/517* (2006.01)
*C23C 16/56* (2006.01)
*C08J 7/16* (2006.01)
*H01L 21/3105* (2006.01)
*H01L 21/4757* (2006.01)

(52) U.S. Cl. ............... 427/509; 427/515; 427/542; 427/544; 427/553; 427/557; 427/558; 427/59; 427/255.37; 427/255.28; 438/788; 438/789; 438/790; 438/784

(58) Field of Classification Search ............... None
See application file for complete search history.

(56) References Cited

U.S. PATENT DOCUMENTS 4,303,695 A * 12/1981 McCann et al. ............ 427/495

(Continued)

FOREIGN PATENT DOCUMENTS

EP      1037275      9/2000

(Continued)

OTHER PUBLICATIONS

A. Hozumi, et al., Low-Temperature Elimination of Organic Components from Mesostructured Organic—Inorganic Composite Films Using Vacuum Ultraviolet Light, Chem. Mater. 2000, 12, 3842-3847, no month.

(Continued)

*Primary Examiner*—Marianne L Padgett
(74) *Attorney, Agent, or Firm*—Joseph D. Rossi

(57) ABSTRACT

Low dielectric materials and films comprising same have been identified for improved performance when used as interlevel dielectrics in integrated circuits as well as methods for making same. In certain embodiments of the invention, there is provided a low-temperature process to remove at least a portion of at least one pore-forming material within a composite film thereby forming a porous film. The pore-forming material may be removed via exposure to at least one energy source, preferably an ultraviolet light source, in a non-oxidizing atmosphere.

40 Claims, 11 Drawing Sheets

U.S. PATENT DOCUMENTS

| | | | | |
|---|---|---|---|---|
| 5,454,915 | A | 10/1995 | Shor et al. | 204/129.3 |
| 5,593,737 | A * | 1/1997 | Meinzer et al. | 427/512 |
| 5,895,263 | A * | 4/1999 | Carter et al. | 438/624 |
| 5,935,646 | A * | 8/1999 | Raman et al. | 427/244 |
| 6,042,994 | A | 3/2000 | Yang et al. | 430/296 |
| 6,054,206 | A | 4/2000 | Mountsier | 428/312.8 |
| 6,068,884 | A * | 5/2000 | Rose et al. | 438/762 |
| 6,174,932 | B1 * | 1/2001 | Pachl et al. | 522/100 |
| 6,231,989 | B1 * | 5/2001 | Chung et al. | 428/447 |
| 6,238,751 | B1 | 5/2001 | Mountsier | 427/574 |
| 6,271,273 | B1 * | 8/2001 | You et al. | 521/61 |
| 6,284,050 | B1 | 9/2001 | Shi et al. | 118/715 |
| 6,312,793 | B1 | 11/2001 | Grill et al. | 428/312.6 |
| 6,346,300 | B1 * | 2/2002 | Ruepping | 427/517 |
| 6,426,235 | B1 * | 7/2002 | Matsushita et al. | 438/22 |
| 6,472,076 | B1 * | 10/2002 | Hacker | 428/447 |
| 6,475,930 | B1 | 11/2002 | Junker et al. | 438/787 |
| 6,566,278 | B1 * | 5/2003 | Harvey et al. | 438/778 |
| 6,596,467 | B2 * | 7/2003 | Gallagher et al. | 430/314 |
| 6,596,834 | B2 * | 7/2003 | Zhong | 528/31 |
| 6,756,085 | B2 * | 6/2004 | Waldfried et al. | 427/515 |
| 6,780,498 | B2 * | 8/2004 | Nakata et al. | 428/312.6 |
| 6,872,456 | B2 * | 3/2005 | Boisvert et al. | 428/447 |
| 6,913,796 | B2 * | 7/2005 | Albano et al. | 427/536 |
| 6,919,106 | B2 * | 7/2005 | Murakami et al. | 427/535 |
| 6,930,034 | B2 * | 8/2005 | Colburn et al. | 438/619 |
| 7,098,149 | B2 * | 8/2006 | Lukas et al. | 438/778 |
| 7,256,139 | B2 * | 8/2007 | Moghadam et al. | 438/758 |
| 2001/0018129 | A1 | 8/2001 | Shiota et al. | 428/447 |
| 2001/0038919 | A1 | 11/2001 | Berry, III et al. | 428/446 |
| 2002/0102413 | A1 | 8/2002 | Han et al. | 428/446 |
| 2002/0106500 | A1 | 8/2002 | Albano et al. | 428/304.4 |
| 2002/0132496 | A1 * | 9/2002 | Ball et al. | 438/786 |
| 2003/0003288 | A1 * | 1/2003 | Nakata et al. | 428/304.4 |
| 2003/0032300 | A1 | 2/2003 | Waldfried et al. | 438/725 |
| 2003/0054115 | A1 * | 3/2003 | Albano et al. | 427/487 |
| 2003/0087042 | A1 * | 5/2003 | Murakami et al. | 427/551 |
| 2004/0018319 | A1 * | 1/2004 | Walfried et al. | 427/508 |
| 2004/0058090 | A1 * | 3/2004 | Waldfried et al. | 427/487 |
| 2004/0137728 | A1 * | 7/2004 | Gallagher et al. | 438/689 |
| 2004/0185679 | A1 * | 9/2004 | Ott et al. | 438/781 |
| 2005/0048795 | A1 | 3/2005 | Ko et al. | |
| 2005/0123735 | A1 * | 6/2005 | Lu et al. | 428/304.4 |
| 2005/0255710 | A1 * | 11/2005 | You et al. | 438/780 |
| 2006/0024976 | A1 * | 2/2006 | Waldfried et al. | 438/778 |
| 2006/0078676 | A1 * | 4/2006 | Lukas et al. | 427/248.1 |
| 2006/0079099 | A1 * | 4/2006 | Nguyen et al. | 438/789 |

FOREIGN PATENT DOCUMENTS

| | | | |
|---|---|---|---|
| EP | 1 108 763 | | 6/2001 |
| EP | 1 197 998 | | 4/2002 |
| EP | 1197998 | * | 4/2002 |
| EP | 1 482 550 | | 12/2004 |
| TW | 540118 | | 3/1990 |
| WO | WO 0002241 | | 1/2000 |
| WO | WO 0207191 | | 1/2002 |
| WO | WO 02/11204 | | 2/2002 |
| WO | WO 02065534 | | 8/2002 |
| WO | WO 2004/083495 | | 9/2004 |
| WO | WO 2005/019303 | | 3/2005 |

OTHER PUBLICATIONS

M. Ouyang, et al., Conversion of Some Siloxane Polymers to Silicon Oxide by UV/Ozone Photochemical Processes, Chem Mater. 2000, 12, 1591-1596, no month, but published on web May 2000.

A. Hozumi, et al., Micropatterned Silica Films with Ordered Nanopores Fabricated through Photocalcination, National Institute of Advanced Industrial Science & Technology, vol. 1, No. 8, Aug. 2001.

T. Clark, Jr., et al., A New Application of UV—Ozone Treatment in the Preparation of Substrate-Supported,Mesoporous Thin Films, Chem Mater. 2000, 12, 3879-3884, no month, but pub on web. Dec. 2000.

Q. Han, et al., "Ultra Low-k Porous Silicon Dioxide Films from a Plasma Process," IEEE (2001), pp. 171-173, no month.

C. Waldfried, et al., "Single Wafer RapidCuring™ of Porous Low-k Materials," IEEE (2002), pp. 226-228, no month.

Dixit, Girish, et al., "Film Properties and Integration Performance of a Nano-Porous Carbon Doped Oxide", Applied Materials, Inc, Santa Clara, California, USA, International Interconnect Technology Conference, Jun. 2004.

Hozumi, A., et al., "Photocalcination of Mesoporous Silica Films Using Vacuum Ultraviolet Light", Advanced Materials, Wiley VCH, Weinheim, DE, vol. 12, No. 13, Jul. 5, 2000, pp. 985-987.

Grill, A. et al., "Multiphase Low-K Materials Prepared by PECVD", Electrochemical Society Proceedings, vol. 2000-5, pp. 55-62.

* cited by examiner 2) thin film before (---) and after(___) UV curing for 10 minutes at 5 millitorr. Note the decrease in absorption near 2900 cm$^{-1}$ and 1400 cm$^{-1}$, regions arising from C-H and C=C stretching, respectively.

NON-THERMAL PROCESS FOR FORMING POROUS LOW DIELECTRIC CONSTANT FILMS

CROSS-REFERENCE TO RELATED APPLICATIONS

This application is a continuation-in-part of U.S. patent application Ser. No. 10/295,568, filed Nov. 14, 2002, now U.S. Pat. No. 7,404,990 the disclosure of which is incorporated herein by reference in its entirety.

BACKGROUND OF THE INVENTION

The present invention relates generally to the formation of porous films. More specifically, the invention relates to porous materials and films comprising same having a low dielectric constant and methods for making same.

There is a continuing desire in the microelectronics industry to increase the circuit density in multilevel integrated circuit devices such as memory and logic chips to improve the operating speed and reduce power consumption. In order to continue to reduce the size of devices on integrated circuits, the requirements for preventing capacitive crosstalk between the different levels of metallization becomes increasingly important. These requirements can be summarized by the expression "RC", whereby "R" is the resistance of the conductive line and "C" is the capacitance of the insulating dielectric interlayer. Capacitance "C" is inversely proportional to line spacing and proportional to the dielectric constant (k) of the interlayer dielectric (ILD). Such low dielectric materials are desirable for use, for example, as premetal dielectric layers or interlevel dialectric layers.

Undoped silica glass ($SiO_2$), subsequently referred to herein as "USG", has been long used in integrated circuits as a primary insulating material because of its relatively lower dielectric constant of approximately 4.0 compared to other inorganic materials. The industry has attempted to produce silica-based materials with lower dielectric constants by incorporating organics or other materials within the silicate lattice. For example, dielectric constants ranging from 2.7 to 3.5 can be achieved by incorporating terminal groups such as fluorine or methyl into the silicate lattice. These materials are typically deposited as dense films (density~1.5 $g/cm^3$) and integrated within the IC device using process steps similar to those for forming USG films.

Since the dielectric constant of air is nominally 1.0, yet another approach to reducing the dielectric constant of a material may be to introduce porosity or reducing the density of the material. A dielectric film when made porous may exhibit lower dielectric constants compared to a relatively denser film.

Porosity has been introduced in low dielectric materials through a variety of different means. For example, porosity may be introduced by decomposing part of the film resulting in a film having an increased porosity and a lower density. Additional fabrication steps may be required for producing porous films that ultimately add both time and energy to the fabrication process. Minimizing the time and energy required for fabrication of these films is desirable; thus discovering materials that can be processed easily, or alternative processes that minimize processing time, is highly advantageous.

A method used extensively in the literature for introducing porosity into a film is thermal annealing to decompose at least a portion of the film thereby creating pores and ultimately lowering the dielectric constant. In the annealing step, or curing step, the film is typically heated to decompose and/or remove volatile components and substantially cross-link the film. U.S. Pat. No. 6,312,793 describes a multiphasic material having a first phase consisting essentially of Si, C, O, and H, a second phase consisting essentially of C and H, and a multiplicity of pores. The material is heated to a temperature of at least 300° C. and for a time of at least 15 minutes to induce removal of one of the phases. Published patent application WO 00/02241 describes heating an alkoxysilane material at a temperature from 100 to 400° C. for a time of 1 to 10 minutes to induce formation of pores by removing the solvent contained therein. Published patent application WO 02/07191A2 describes heating a silica zeolite thin film to a temperature range of 350 to 550° C. for an unspecified amount of time to induce adsorbed material to leave the zeolitic framework thereby lowering the dielectric constant.

The majority of the aforementioned processes require curing steps at temperatures of 300° C. or higher and times of 30 minutes or longer. A primary concern in the production of a low dielectric film may be the overall thermal budget of the IC device. Consequently, various components of IC devices such as Cu metal lines can only be subjected to processing temperatures for short time periods before their performance deteriorates due to undesirable diffusion processes.

An alternative to the thermal anneal or curing step is the use of ultraviolet ("UV") light in combination with an oxygen-containing atmosphere to create pores within the material and lower the dielectric constant. The references, Hozumi, A. et al. "Low Temperature Elimination of Organic Components from Mesostructured Organic-Inorganic Composite Films Using Vacuum Ultraviolet Light", Chem. Mater. 2000 Vol. 12, pp. 3842-47 ("Hozumi I") and Hozumi, A et al., "Micropattterned Silica Films with Ordered Nanopores Fabricated through Photocalcination", NanoLetters 2001,1(8), pp. 395-399 ("Hozumi II"), describe removing a cetyltrimethylammonium chloride (CTAC) pore-former from a tetraethoxysilane (TEOS) film using ultraviolet ("VUV") light (172 nm) in the presence of oxygen. The reference, Ouyang, M., "Conversion of Some Siloxane Polymers to Silicon Oxide by UV/Ozone Photochemical Processes", Chem. Mater. 2000, 12(6), pp. 1591-96, describes using UV light ranging from 185 to 254 nm to generate ozone in situ to oxidize carbon side groups within poly(siloxane) films and form a $SiO_2$ film. The reference, Clark, T., et al., "A New Preparation of UV-Ozone Treatment in the Preparation of Substrate-Supported Mesoporous Thin Films", Chem. Mater. 2000, 12(12), pp. 3879-3884, describes using UV light having a wavelength between 187 and 254 nm to produce ozone and atomic oxygen to remove organic species within a TEOS film. These techniques, unfortunately, may adversely effect the resultant film by chemically modifying the bonds that remain within the material. For example, exposure of these materials to an oxidizing atmosphere can result in the oxidation of the C atoms contained therein which has an adverse effect on the dielectric properties of the material.

U.S. Pat. No. 6,284,500 describes using UV light in the 230 to 350 nm wavelength range to photoinitiate cross-linking within an organic polymer film formed by CVD or an organosilsiquoxane film formed by spin-on deposition to improve the adhesion and mechanical properties of the film. The '500 patent teaches that a thermal annealing step may be used to stabilize the cross-linked film.

Published U.S. patent application Ser. No. 2003/054115 (the '115 application) teaches UV curing a porous dielectric material produced by CVD or spin-on deposition methods to produce a UV-cured porous dielectric material having an improved modulus and comparable dielectric constant. The '115 application demonstrates that UV exposure in an $O_2$ atmosphere is more effective than UV exposure in a $N_2$ atmosphere. However, the '115 application also teaches that the UV cure can generate a notable amount of polar species in the porous dielectric materials. Further, the '115 application states that "in all cases a subsequent or possibly concomitant anneal step is necessary in order to remove the Si—OH bonds which are typically generated during the UV curing process."

U.S. Pat. No. 6,566,278 teaches densifying a carbon-doped, silicon oxide ($SiC_xO_y$) film by exposing the film to UV radiation. The carbon-doped silicon oxide film is deposited via chemical vapor deposition of an oxygen-supplying gas and an organosilane silicon supplying gas. The film is then exposed to UV radiation generated from an excited gas species such as xenon, mercury, deuterium, or $KrCl_2$.

Accordingly, there is a need in the art to provide an improved method to produce low density and porous materials. There is also a need to provide a process for preparing a low dielectric film that does not inhibit the pore formation process. There is a further need to provide a method that is selective in removing certain material from a film. Due to thermal budget concerns, there is an additional need for a low temperature treatment for the production of porous films for low dielectric constant materials for integrated circuits.

All references cited herein are incorporated herein by reference in their entirety.

BRIEF SUMMARY OF THE INVENTION

The present invention satisfies one, if not all, of the needs of the art by providing a process for forming a porous film. Specifically, in one aspect of the present invention, there is provided a process comprising: forming a composite film onto at least a portion of a substrate wherein the composite film comprises at least one structure-forming material and at least one pore-forming material and exposing the composite film to one or more energy sources within a non-oxidizing atmosphere for a time sufficient to remove at least a portion of the at least one pore-forming material contained therein and provide the porous film wherein the porous film is substantially free of Si—OH bonds.

In another aspect of the present invention, there is provided a process for preparing a porous film comprising: forming a composite film onto at least a portion of a substrate wherein the composite film comprises at least one structure-forming material and at least one pore-forming material; exposing the composite film to one or more energy sources within a non-oxidizing atmosphere for a time sufficient to remove at least a portion of the at least one pore-forming material contained therein and provide the porous film wherein the porous film is substantially free of Si—OH bonds; and treating the porous film with one or more second energy sources.

In a still further aspect of the present invention, there is provided a process for preparing a porous film comprising: forming a composite film onto at least a portion of a substrate wherein the composite film comprises at least one structure-forming material and at least one pore-forming material and exposing the composite film to an ultraviolet light source within a non-oxidizing atmosphere for a time sufficient to remove at least a portion of the at least one pore-forming material contained therein and provide the porous film wherein a density of the porous film is at least 10% less than a density of the film prior to the exposing step.

In yet a further aspect of the present invention, there is provided a process for preparing a porous film comprising: forming a composite film having a first density onto at least a portion of a substrate wherein the composite film comprises at least one structure-forming material and at least one pore-forming material and exposing the composite film to an ultraviolet light source within a non-oxidizing atmosphere for a time sufficient to substantially remove the at least one pore-forming material contained therein and provide the porous film having a second density wherein the second density is at least 10 percent less than the first density.

In another aspect of the present invention, there is provided a chemical vapor deposition method for producing a porous film represented by the formula $Si_vO_wC_xH_yF_z$, where v+w+x+y+z=100%, v is from 10 to 35 atomic %, w is from 10 to 65 atomic %, x is from 5 to 30 atomic %, y is from 10 to 50 atomic %, and z is from 0 to 15 atomic % comprising: providing a substrate within a vacuum chamber; introducing into the vacuum chamber gaseous reagents including at least one structure-former gas selected from the group consisting of an organosilane and an organosiloxane, and a pore-former distinct from the at least one precursor gas; applying energy to the gaseous reagents in the vacuum chamber to induce reaction of the gaseous reagents to deposit a composite film on the substrate, wherein the composite film comprises at least one structure-forming material and at least one pore-forming material, and the preliminary film is deposited without added oxidants; and exposing the composite film to an ultraviolet light source within a non-oxidizing atmosphere for a time sufficient to substantially remove the at least one pore-forming material contained therein and provide the porous film comprising a plurality of pores and a dielectric constant of 2.7 or less wherein the porous film is substantially free of Si—OH bonds.

In yet a further aspect of the present invention, there is provided a porous film having a dielectric constant of 2.7 or below. The porous film is comprised of: at least one structure-forming material consisting essentially of Si, C, H, O, and F; at least one pore-forming material consisting essentially of C and H and dispersed within the structure-forming material; and a plurality of pores having an average size of about 100 nm or less wherein the plurality of pores are formed by removing at least a portion of the pore-forming material by exposure to an ultraviolet light source wherein the porous film is substantially free of Si—OH bonds.

In yet another aspect of the present invention, there is provided a mixture for depositing an organosilicate film comprising a dielectric constant of 3.5 or below, the mixture comprising at least one structure-former precursor selected from the group consisting of an organosilane and an organosiloxane wherein the at least one structure-former precursor and/or the organosilicate film exhibits an absorbance in the 200 to 400 wavelength range.

In an additional aspect of the present invention, there is provided a mixture for depositing an organosilicate film comprising: from 5 to 95% of a structure-former precursor selected from the group consisting of an organosilane and an organosiloxane and from 5 to 95% of a pore-former precursor wherein at least one of the precursors and/or the organosilicate film exhibits an absorbance in the 200 to 400 nm wavelength range.

These and other aspects of the invention will become apparent from the following detailed description.

DETAILED DESCRIPTION OF THE INVENTION

Figure 1A:
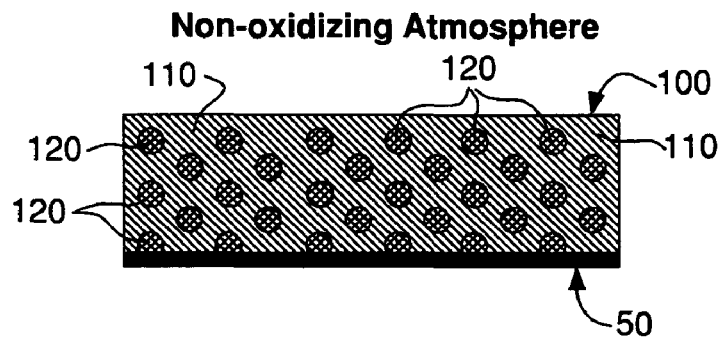
FIGS. 1a through 1c provides an illustration of the various steps of one embodiment of the present invention wherein the exposure to UV radiation energy results in the formation of pores within the film.

The present invention is directed towards the preparation of porous and low density materials and films. In one embodiment of the present invention, there is provided a method for preparing a porous, low dielectric film that exhibits sufficient mechanical properties, thermal stability, and chemical resistance such as to oxygen or aqueous oxidizing environments thereby making it suitable for use as an interlayer dielectric in integrated circuits. The present invention provides a process for preparing a porous film from a composite film containing at least one structure-forming material and at least one pore-forming material. The composite film is exposed to one or more energy sources to remove at least a portion, or more preferably substantially remove, the at least one pore-forming material contained therein.

The composite material is preferably a film that is formed onto at least a portion of a substrate. Suitable substrates that may be used include, but are not limited to, semiconductor materials such as gallium arsenide ("GaAs"), boronitride ("BN") silicon, and compositions containing silicon such as crystalline silicon, polysilicon, amorphous silicon, epitaxial silicon, silicon dioxide ("SiO$_2$"), silicon carbide ("SiC"), silicon oxycarbide ("SiOC"), silicon nitride ("SiN"), silicon carbonitride ("SiCN"), organosilicate glasses ("OSG"), organofluorosilicate glasses ("OFSG"), fluorosilicate glasses ("FSG"), and other appropriate substrates or mixtures thereof. Substrates may further comprise a variety of layers to which the film is applied thereto such as, for example, anti-reflective coatings, photoresists, organic polymers, porous organic and inorganic materials, metals such as copper and aluminum, or diffusion barrier layers, e.g., TiN, Ti(C)N, TaN, Ta(C)N, Ta, W, WN, or W(C)N. The porous films of the present invention are preferably capable of adhering to at least one of the foregoing materials sufficiently to pass a conventional pull test, such as an ASTM D3359-95a tape pull test.

As mentioned previously, the composite film comprises at least two materials: at least one structure-forming material and at least one pore-forming material. The at least one pore-forming material may be dispersed within the structure-forming materials. The term "dispersed" as used herein includes discrete areas of pore-forming material, air-gap (i.e., relatively large areas of pore-forming material contained within a structure-forming shell), or bi-continuous areas of pore-forming material. While not intending to be bound by theory, it is believed that the composite film, when exposed to one or more energy sources, absorbs a certain amount of energy to enable its removal. Depending upon the energy source and the chemistry of the pore-forming material, the chemical bonds within the pore-forming material may be broken thereby facilitating its removal. In this manner, the pore-forming material may be substantially removed from the composite film thereby leaving a porous film that consists essentially of the structure-forming material. The resultant porous film will have a lower density. In some embodiments, the resultant porous film may also have a lower dielectric constant than the composite film.

Figure 1B:
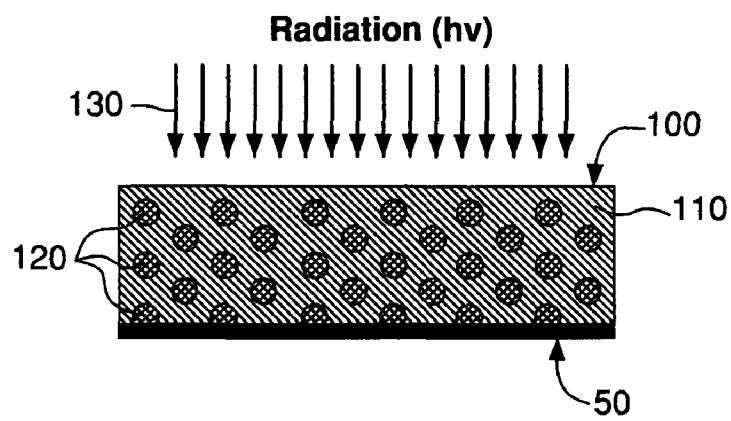
Figure 1C:
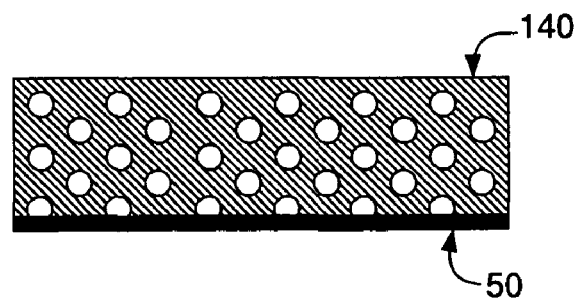

FIGS. 1a through 1c provide an illustration of one embodiment of the method of the present invention. Referring to FIG. 1a, composite film 100 is formed upon at least a portion of a substrate 50. Composite film 100 comprises at least two materials: at least one structure-forming material 110 and at least one pore-forming material 120 dispersed within the structure-forming material 110. In certain preferred embodiments, the structure-forming material 110 is an OSG compound containing primarily Si:O:C:H and the at least one pore-forming material 120 is an organic compound containing primarily C:H. In FIG. 1b, composite film 100 is exposed to one or more energy sources such as ultraviolet light 130. In certain embodiments, the exposure step depicted in FIG. 1b may be conducted at one or more temperatures below 425° C. and for a short time interval thereby consuming as little of the overall thermal budget of substrate 50 as possible. Referring now to FIG. 1c, the pore-forming material 120 is substantially removed from the composite film 100 leaving a porous film 140. The resultant porous film 140 may have a lower dielectric constant than the composite film 100.

The at least one structure-forming material of the composite film comprises a compound or compounds that is capable of forming and maintaining an interconnecting network. Examples of these materials include, but are not limited to, undoped silicate glass (SiO$_2$), silicon carbide (SiC) hydrogenated silicon carbide (Si:C:H), silicon oxynitride (Si:O:N), silicon nitride (Si:N), silicon carbonitride (Si:C:N), fluorosilicate glass (Si:O:F), organofluorosilicate glass (Si:O:C:H:F), organosilicate glass (Si:O:C:H), diamond-like carbon, borosilicate glass (Si:O:B:H), or phosphorous doped borosilicate glass (Si:O:B:H:P). In certain preferred embodiments, the structure-forming material comprises a silica compound. The term "silica", as used herein, is a material that has silicon (Si) and oxygen (O) atoms, and possibly additional substituents such as, but not limited to, other elements such as C, H, B, N, P, or halide atoms; alkyl groups; or aryl groups. In certain preferred embodiments, the structure-forming material may comprise an OSG compound represented by the formula $Si_vO_wC_xH_yF_z$, where v+w+x+y+z=100%, v is from 10 to 35 atomic %, w is from 10 to 65 atomic %, x is from 5 to 30 atomic %, y is from 10 to 50 atomic % and z is from 0 to 15 atomic %. Regardless of whether or not the structure-former is unchanged throughout the inventive process, the term "structure-former" as used herein is intended to encompass structure-forming reagents, precursors (or structure-forming substituents) and derivatives thereof, in whatever forms they are found throughout the entire process of the invention.

The at least one pore-forming material of the composite film comprises a compound or compounds that is capable of being easily and preferably substantially removed from the composite film upon exposure to one or more energy sources. The pore-forming material may also be referred to herein as a porogen. A "pore-former" is a reagent that is used to generate void volume within the resultant film. Regardless of whether or not the pore-former is unchanged throughout the inventive process, the term "pore-former" as used herein is intended to encompass pore-forming reagents, precursors, (or pore-forming substituents) and derivatives thereof, in whatever forms they are found throughout the entire process of the invention. Suitable compounds to be used as the pore-forming material of the present invention include, but are not limited to, hydrocarbon materials, labile organic groups, solvents, decomposable polymers, surfactants, dendrimers, hyper-branched polymers, polyoxyalkylene compounds, or combinations thereof. In certain preferred embodiments of the present invention, the pore-forming phase comprises a $C_1$ to $C_{13}$ hydrocarbon compound.

As mentioned previously, the materials of the present invention are formed into a composite films onto at least a portion of a substrate from a precursor composition or mixture using a variety of different methods. These methods may be used by themselves or in combination. Some examples of processes that may be used to form the composite film include the following: thermal chemical vapor deposition, plasma enhanced chemical vapor deposition ("PECVD"), high density PECVD, photon assisted CVD, plasma-photon assisted CVD, cryogenic chemical vapor deposition, chemical assisted vapor deposition, hot-filament chemical vapor deposition, CVD of a liquid polymer precursor, deposition from supercritical fluids, or transport polymerization ("TP"). U.S. Pat. Nos. 6,171,945, 6,054,206, 6,054,379, 6,159,871 and WO 99/41423 provide some exemplary CVD methods that may be used to form the composite film of the present invention. Other processes that can be used to form the film include spin coating, dip coating, Langmuir-blodgett self assembly, or misting deposition methods.

In certain preferred embodiments, the composite film is formed from a mixture of one or more gaseous reagents in a chemical vapor deposition process. Although the phrase "gaseous reagents" is sometimes used herein to describe the reagents, the phrase is intended to encompass reagents delivered directly as a gas to the reactor, delivered as a vaporized liquid, a sublimed solid and/or transported by an inert carrier gas into the reactor. In preferred embodiments of the present invention, the composite film is formed through a PECVD process. Briefly, gaseous reagents are flowed into a reaction chamber such as a vacuum chamber and plasma energy energizes the gaseous reagents thereby forming a film on at least a portion of the substrate. In these embodiments, the composite film can be formed by the codeposition, or alternatively the sequential deposition, of a gaseous mixture comprising at least one silica containing, preferably organosilicon material, that forms the structure-forming material with at least one plasma-polymerizable organic material that forms the pore-forming material. In certain embodiments, the plasma energy applied may range from 0.02 to 7 watts/cm$^2$, more preferably 0.3 to 3 watts/cm$^2$. Flow rates for each of the gaseous reagents may range from 10 to 5000 standard cubic centimeters per minute (sccm). Pressure values in the vacuum chamber during deposition for a PECVD process of the present invention may range from 0.01 to 600 torr, more preferably 1 to 10 torr. It is understood however that process parameters such as plasma energy, flow rate, and pressure may vary depending upon numerous factors such as the surface area of the substrate, the structure-forming and pore-forming materials to be formed, the equipment used in the PECVD process, etc.

In a certain preferred embodiment of the present invention wherein the composite film consists essentially of Si, C, O, H, and F, the composite film is formed by providing a substrate within a vacuum chamber; introducing into the vacuum chamber gaseous reagents that comprises at least one structure-former gas selected from the group consisting of an organosilane and an organosiloxane, at least one precursor gas including a fluorine-providing gas that may form at least a portion of the structure-former, and a pore-former distinct from the at least one precursor gas selected from the group consisting of an organosilane and an organosiloxane; and applying energy to the gaseous reagents in said chamber to induce reaction of the gaseous reagents and to form the film on the substrate. Examples of gaseous reagents used as structure-forming and pore-forming precursors may be found in pending U.S. patent application Ser. Nos. 10/150,798 and 10/137,807, which are commonly assigned to the assignee of the present invention and incorporated herein by reference in its entirety.

Silica-containing gases such as organosilanes and organosiloxanes may be the preferred precursor gases to form the structure-forming material of the chemical vapor deposited composite film. Suitable organosilanes and organosiloxanes include, e.g.: (a) alkylsilanes represented by the formula $R^1{}_nSiR^2{}_{4-n}$, where n is an integer from 1 to 3; $R^1$ and $R^2$ are independently at least one branched or straight chain $C_1$ to $C_8$ alkyl group (e.g., methyl, ethyl), a $C_3$ to $C_8$ substituted or unsubstituted cycloalkyl group (e.g., cyclobutyl, cyclohexyl), a $C_3$ to $C_{10}$ partially unsaturated alkyl group (e.g., propenyl, butadienyl), a $C_6$ to $C_{12}$ substituted or unsubstituted aromatic (e.g., phenyl, tolyl), a corresponding linear, branched, cyclic, partially unsaturated alkyl, or aromatic containing alkoxy group (e.g., methoxy, ethoxy, phenoxy), and $R^2$ is alternatively hydride (e.g., methylsilane, dimethylsilane, trimethylsilane, tetramethylsilane, phenylsilane, methylphenylsilane, cyclohexylsilane, tert-butylsilane, ethylsilane, diethylsilane, tetraethoxysilane, dimethyldiethoxysilane, dimethyldimethoxysilane, dimethylethoxysilane, methyidiethoxysilane, triethoxysilane, trimethylphenoxysilane and phenoxysilane); (b) a linear organosiloxane represented by the formula $R^1(R^2{}_2SiO)_nSiR^2{}_3$ where n is an integer from 1 to 10, or cyclic organosiloxane represented by the formula $(R^1R^2SiO)_n$ where n is an integer from 2 to 10 and $R^1$ and $R^2$ are as defined above (e.g., 1,3,5,7-tetramethylcyclotetrasiloxane, octamethylcyclotetrasiloxane, hexamethylcyclotrisiloxane, hexamethyidisiloxane, 1,1,2,2-tetramethyldisiloxane, and octamethyltrisiloxane); and (c) a linear organosilane oligomer represented by the formula $R^2(SiR^1R^2)_nR^2$ where n is an integer from 2 to 10, or cyclic organosilane represented by the formula $(SiR^1R^2)_n$, where n is an integer from 3 to 10, and $R^1$ and $R^2$ are as defined above (e.g., 1,2-dimethyldisilane, 1,1,2,2-tetramethyldisilane, 1,2-dimethyl-1,1,2,2-dimethoxydisilane, hexamethyidisilane, octamethyltrisilane, 1,2,3,4,5,6-hexaphenylhexasilane, 1,2-dimethyl-1,2-diphenyidisilane and 1,2-diphenyldisilane). In certain embodiments, the organosilane/organosiloxane is a cyclic alkylsilane, a cyclic alkylsiloxane, a cyclic alkoxysilane or contains at least one alkoxy or alkyl bridge between a pair of Si atoms, such as 1,2-disilanoethane, 1,3-disilanopropane, dimethylsilacyclobutane, 1,2-bis(trimethylsiloxy)cyclobutene, 1,1-dimethyl-1-sila-2,6-dioxacyclohexane, 1,1-dimethyl-1-sila-2-oxacyclohexane, 1,2-bis(trimethylsiloxy)ethane, 1,4-bis(dimethylsilyl)benzene, octamethylcyclotetrasiloxane (OMCTS), or 1,3-(dimethylsilyl)cyclobutane. In certain embodiments, the organosilane/organosiloxane contains a reactive side group selected from the group consisting of an epoxide, a carboxylate, an alkyne, a diene, phenyl ethynyl, a strained cyclic group and a $C_4$ to $C_{10}$ group which can sterically hinder or strain the organosilane/organosiloxane, such as trimethylsilylacetylene, 1-(trimethylsilyl)-1,3-butadiene, trimethylsilylcyclopentadiene, trimethylsilylacetate and di-tert-butoxydiacetoxysilane.

In certain embodiments, the at least one structure-forming material further comprises fluorine. Preferred fluorine-providing gases for a CVD-deposited composite film lack any F—C bonds (i.e., fluorine bonded to carbon) that could end up in the film. Thus, preferred fluorine-providing gases include, e.g., $SiF_4$, $NF_3$, $F_2$, HF, $SF_6$, $ClF_3$, $BF_3$, $BrF_3$, $SF_4$, $NF_2Cl$, $FSiH_3$, $F_2SiH_2$, $F_3SiH$, organofluorosilanes and mixtures thereof, provided that the organofluorosilanes do not include any F—C bonds. Additional preferred fluorine-providing gases include the above mentioned alkylsilanes, alkoxysilanes, linear and cyclic organosiloxanes, linear and cyclic organosilane oligomers, cyclic or bridged organosilanes, and organosilanes with reactive side groups, provided a fluorine atom is substituted for at least one of the silicon substituents, such that there is at least one Si—F bond. More specifically, suitable fluorine-providing gases include, e.g., fluorotrimethylsilane, difluorodimethylsilane methyltrifluorosilane, flurotriethoxysilane, 1,2-difluoro-1,1,2,2,-tetramethyidisilane, or difluorodimethoxysilane.

In embodiments where the composite film is formed through a spin-on approach, the composite film is formed from a mixture that comprises, inter alia, at least one structure-forming precursor, preferably a silica source, a pore-forming precursor or pore-former, a catalyst, and water. The mixture may further comprise a solvent and a surfactant. In brief, dispensing the mixture onto a substrate and evaporating the solvent and water can form the composite film. The surfactant, remaining solvent and water, and pore-former are generally removed by exposing the coated substrate to one or more energy sources and for a time sufficient to produce the low dielectric film. In some instances, the composite film may be pre-heated to substantially complete the hydrolysis of the silica source, continue the crosslinking process, and drive off any remaining solvent, if present, from the film.

In certain preferred embodiments, the mixture used to form the composite film preferably comprises a silica source that may form the structure-forming material. A "silica source", as used herein, is a compound having silicon (Si) and oxygen (O), and possibly additional substituents such as, but not limited to, other elements such as H, B, C, P, or halide atoms; alkyl groups; or aryl groups. The term "alkyl" as used herein includes straight chain, branched, or cyclic alkyl groups, preferably containing from 1 to 24 carbon atoms, or more preferably from 1 to 13 carbon atoms. This term applies also to alkyl moieties contained in other groups such as haloalkyl, alkaryl, or aralkyl. The term "alkyl" further applies to alkyl moieties that are substituted. The term "aryl" as used herein includes six to twelve member carbon rings having aromatic character. The term "aryl" also applies to aryl moieties that are substituted. The silica source may include materials that have a high number of Si—O bonds, but can further include Si—O—Si bridges, Si—R—Si bridges, Si—C bonds, Si—F bonds, Si—H bonds or a portion of the material can also have C—H bonds. It is preferred that at least one silica source have a minimum of Si—OH bonds. Other examples of the silica source may include a fluorinated silane or fluorinated siloxane such as those provided in U.S. Pat. No. 6,258,407.

Another example of a silica source may include compounds that produce a Si—H bond upon removal of the pore-forming material.

Still further examples of the source are found in the non-hydrolytic chemistry methods described, for example, in the references Hay et al., "Synthesis of Organic-Inorganic Hybrids via the Non-hydrolytic Sol-Gel Process", Chem. Mater., 13, 3396-3403 (2001) or Hay, et al., "A Versatile Route to Organically-Modified Silicas and Porous Silicas via the Non-Hydrolytic Sol-Gel Process", J. Mater. Chem., 10, 1811-1818 (2000).

Yet another example of the silica source may include colloidal silica, fumed silica, or silicic acid starting materials.

Still other examples of silica sources include silsesquioxanes such as hydrogen silsesquioxanes (HSQ, $HSiO_{1.5}$) and methyl silsesquioxanes (MSQ, $RSiO_{1.5}$ where R is a methyl group).

Further examples of the suitable silica sources include those described in U.S. Pat. No. 6,271,273 and EP Nos. 1,088,868; 1,123,753, and 1,127,929. In preferred embodiments, the silica source may be a compound represented by the following: $R_aSi(OR^1)_{4-a}$, wherein R represents a hydrogen atom, a fluorine atom, or a monovalent organic group; $R^1$ represents a monovalent organic group; and a is an integer of 1 or 2; $Si(OR^2)_4$, where $R^2$ represents a monovalent organic group; or $R^3{}_b(R^4O)_{3-b}Si—(R^7)_d—Si(OR^5)_{3-c}R^6{}_c$, wherein $R^3$ to $R^6$ may be the same or different and each represents a monovalent organic group; b and c may be the same or different and each is a number of 0 to 2; $R^7$ represents an oxygen atom, a phenylene group, or a group represented by —$(CH_2)_n$-, wherein n is an integer of 1 to 6; and d is 0 or 1; or combinations thereof. The term "monovalent organic group" as used herein relates to an organic group bonded to an element of interest, such as Si or O, through a single C bond, i.e., Si—C or O—C.

In certain embodiments, the silica source may be added to the mixture as the product of hydrolysis and condensation. Hydrolysis and condensation of the silica source occurs by adding water and a catalyst to a solvent and adding the silica source at a time, intermittently or continuously, and conducting hydrolysis and condensation reactions while stirring the mixture at a temperature range generally from −30 to 100° C., preferably from 20 to 100° C., for 0 to 24 hours. The composition can be regulated to provide a desired solid content by conducting concentration or dilution with the solvent in each step of the preparation. Further, the silica source may be a compound that generates acetic acid when hydrolyzed.

The hydrolysis and condensation of the silica source can occur at any point during the formation of the composite film, i.e., before adding to the mixture, after adding to the mixture, prior to, and/or during exposure to at least one energy source, etc. For example, in certain embodiments of the present invention, the one silica source is combined with the solvent, water, and surfactant in a vessel and the catalyst is gradually added into the vessel and mixed. It is envisioned that a variety of different orders of addition to the mixture can be used without departing from the spirit of the present invention.

The catalyst suitable for the present invention includes any organic or inorganic acid or base that can catalyze the hydrolysis of substituents from the silica source in the presence of water, and/or the condensation of two silica sources to form a Si—O—Si bridge. The catalyst can be an organic base such as, but not limited to, quaternary ammonium salts and hydroxides, such as ammonium or tetramethylammonium, amines such as primary, secondary, and tertiary amines, and amine oxides. The catalyst can also be an acid such as, but not limited to, nitric acid, maleic, oxalic, acetic, formic, glycolic, glyoxalic acid, or mixtures thereof. In preferred embodiments, the catalyst comprises nitric acid.

Solvents that are suitable for the use in the present invention may include any solvents that exhibit solubility with the reagents. Solvents can be, for example, alcohol solvents, ketone solvents, amide solvents, or ester solvents. In certain embodiments the solvents may be a supercritical fluid such as carbon dioxide, fluorocarbons, sulfur hexafluoride, alkanes, and other suitable multi-component mixtures, etc. In certain embodiments, one or more solvents used in the present invention have relatively low boiling points, i.e., below 160° C. These solvents include, but are not limited to, tetrahydrofuran, acetone, 1,4-dioxane, 1,3-dioxolane, ethyl acetate, and methyl ethyl ketone. Other solvents, that can be used in the present invention but have boiling points above 160° C., include dimethylformamide, dimethylacetamide, N-methyl pyrrolidone, ethylene carbonate, propylene carbonate, glycerol and derivatives, naphthalene and substituted versions, acetic acid anyhydride, propionic acid and propionic acid anhydride, dimethyl sulfone, benzophenone, diphenyl sulfone, phenol, m-cresol, dimethyl sulfoxide, diphenyl ether, terphenyl, and the like. Preferred solvents include propylene glycol propyl ether (PGPE), 3-heptanol, 2-methyl-1-pentanol, 5-methyl-2-hexanol, 3-hexanol, 2-heptano, 2-hexanol, 2,3-dimethyl-3-pentanol, propylene glycol methyl ether acetate (PGMEA), ethylene glycol n-butyl ether, propylene glycol n-butyl ether (PGBE), 1-butoxy2-propanol, 2-methyl-3-pentanol, 2-methoxyethyl acetate, 2-butoxyethanol, 2-ethoxyethyl acetoacetate, 1-pentanol, and propylene glycol methyl ether. Still further exemplary solvents include lactates, pyruvates, and diols. Further exemplary solvents include those solvents listed in EP 1,127,929. The solvents enumerated above may be used alone or in combination of two or more solvents.

The mixture used to form the composite films of the present invention further comprises one or more pore-forming precursors that comprise the pore-forming material. In subsequent process steps, the pore-forming material is used to generate void volume within the resultant porous film upon its removal. The pore-former in the composite film may or may not be in the same form as the pore-former within the mixture and/or introduced to the reaction chamber. As well, the pore-former removal process may liberate the pore-former or fragments thereof from the film. In essence, the pore-former reagent (or pore-former substituent attached to the precursor), the pore-former in the composite film, and the pore-former being removed may or may not be the same species, although it is preferable that they all originate from the pore-former reagent (or pore-former substituent). In certain embodiments of the present invention, the pore-former may be a hydrocarbon compound. Exemplary hydrocarbon compounds may include at least one of the following:

a cyclic hydrocarbon having a cyclic structure and the formula $C_nH_{2n}$, where n is 4 to 14, a number of carbons in the cyclic structure is between 4 and 10, and the at least one cyclic hydrocarbon optionally contains a plurality of simple or branched hydrocarbons substituted onto the cyclic structure;

a linear or branched, saturated, singly or multiply unsaturated hydrocarbon of the general formula $C_nH_{(2n+2)-2y}$, where n is a number ranging from 2 to 20 and where y is a number ranging from 0 to n;

a singly or multiply unsaturated cyclic hydrocarbon having a cyclic structure and the formula $C_nH_{2n-2x}$, where x is a number of unsaturated sites, n is a number ranging from 4 to 14, wherein the number of carbons in the cyclic hydrocarbon ranges from 4 to 10, and the at least one singly or multiply unsaturated cyclic hydrocarbon optionally contains a plurality of simple or branched hydrocarbons substituents substituted onto the cyclic structure, and contains endocyclic unsaturation or unsaturation on one of the hydrocarbon substituents;

a one bicyclic hydrocarbon-having a bicyclic structure and the formula $C_nH_{2n-2}$, where n is a number ranging from 4 to 14, wherein a number of carbons in the bicyclic hydrocarbon structure ranges from 4 to 12, and the at least one bicyclic hydrocarbon optionally contains a plurality of simple or branched hydrocarbons substituted onto the bicyclic structure;

a multiply unsaturated bicyclic hydrocarbon having a bicyclic structure and the formula $C_nH_{2n-(2+2x)}$, where x is a number of unsaturated sites, n is a number ranging from 4 to 14, wherein a number of carbons in the multiply unsaturated bicyclic hydrocarbon structure is from 4 to 12, and the at least one multiply unsaturated bicyclic hydrocarbon optionally contains a plurality of simple or branched hydrocarbons substituents substituted onto the bicyclic structure, and contains endocyclic unsaturation or unsaturation on one of the hydrocarbon substituents; and a tricyclic hydrocarbon having a tricyclic structure and the formula $C_nH_{2n-4}$, where n is a number ranging from 4 to 14, wherein the number of carbons in the tricyclic structure ranges from 4 to 12, and the at least one tricyclic hydrocarbon optionally contains a plurality of simple or branched hydrocarbons substituted onto the cyclic structure.

Examples of the aforementioned compounds include, but are not limited to, alpha-terpinene, limonene, cyclohexane, gamma-terpinene, camphene, dimethylhexadiene, ethylbenzene, norbornadiene, cyclopentene oxide, 1,2,4-trimethylcyclohexane, 1,5-dimethyl-1,5-cyclooctadiene, camphene, adamantane, 1,3-butadiene, substituted dienes, gamma-terpinene, alpha-pinene, beta-pinene, and decahydronaphthelene.

In certain embodiments of the present invention, the pore-former may include labile organic groups. When some labile organic groups are present in the reaction mixture, the labile organic groups may contain sufficient oxygen to convert to gaseous products during the cure step. In yet other embodiments of the present invention, a film is deposited via CVD from a mixture comprising the labile organic groups with a peroxide compound followed by thermal annealing. Some examples of compounds containing labile organic groups include the compounds disclosed in U.S. Pat. No. 6,171,945, which is incorporated herein by reference in its entirety.

In some embodiments of the present invention, the pore-former may be a solvent. Solvents suitable for the present invention may be any of the solvents previously mentioned. In this connection, the solvent is generally present during at least a portion of the cross-linking of the matrix material. Solvents typically used to aid in pore formation have relatively higher boiling points, i.e., greater than 200° C.

In certain embodiments, the pore-former may be a small molecule such as those described in the reference Zheng, et al., "Synthesis of Mesoporous Silica Materials with Hydroxyacetic Acid Derivatives as Templates via a Sol-Gel Process", J. Inorg. Organomet. Polymers, 10,103-113 (2000).

The pore-former could also be a decomposable polymer. The decomposable polymer may be radiation decomposable or thermally decomposable. The term "polymer", as used herein, also encompasses the terms oligomers and/or copolymers unless expressly stated to the contrary. Radiation decomposable polymers are polymers that decompose upon exposure to radiation, e.g., ultraviolet, X-ray, electron beam, or the like. Thermally decomposable polymers undergo thermal decomposition at temperatures that approach the condensation temperature of the silica source materials and are present during at least a portion of the cross-linking. Such polymers are that which foster templating of the vitrification reaction, control and define pore size, and decompose and diffuse out of the matrix at the appropriate time in processing. Examples of these polymers include polymers that have an architecture that provides a three-dimensional structure such as, but not limited to, block copolymers, i.e., diblock, tri-block, and multiblock copolymers; star block copolymers; radial diblock copolymers; graft diblock copolymers; cografted copolymers; dendrigraft copolymers; tapered block copolymers; and combinations of these architectures. Further examples of degradable polymers are found in U.S. Pat. No. 6,204,202, which is incorporated herein by reference in its entirety.

The pore-former of the present invention could also comprise a surfactant. For silica sol-gel based films in which the porosity is introduced by the addition of surfactant that is subsequently removed, varying the amount of surfactant can vary porosity. Typical surfactants exhibit an amphiphilic nature, meaning that they can be both hydrophilic and hydrophobic at the same time. Amphiphilic surfactants possess a hydrophilic head group or groups which have a strong affinity for water and a long hydrophobic tail which is organophilic and repels water. The surfactants can be anionic, cationic, nonionic, or amphoteric. Further classifications of surfactants include silicone surfactants, poly(alkylene oxide) surfactants, and fluorochemical surfactants. However, for the formation of dielectric layers for IC applications, non-ionic surfactants are generally preferred. The surfactants used in the present invention may not behave in the traditional sense, i.e., to form micelles or act as surface active agents. Suitable surfactants for use in the mixture include, but are not limited to, octyl and nonyl phenol ethoxylates such as TRITON® X-114, X-102, X-45, X-15; alcohol ethoxylates such as BRIJ® 56 ($C_{16}H_{33}$ $(OCH_2CH_2)_{10}OH$) (ICI), BRIJ® 58 ($C_{16}H_{33}(OCH_2$ $CH_2)_{20}OH$) (ICI), and acetylenics diols such as SUR-FYNOLS® 465 and 485 (Air Products and Chemicals, Inc.). Further surfactants include polymeric compounds such as the tri-block EO-PO-EO co-polymers PLURONIC® L121, L123, L31, L81, L101 and P123 (BASF, Inc.). Still further exemplary surfactants include alcohol (primary and secondary) ethoxylates, amine ethoxylates, glucosides, glucamides, polyethylene glycols, poly(ethylene glycolco-propylene glycol), or other surfactants provided in the reference *McCutcheon's Emulsifiers and Detergents*, North American Edition for the Year 2000 published by Manufacturers Confectioners Publishing Co. of Glen Rock, N.J.

The pore-former may be a hyper branched or dendrimeric polymer. Hyper branched and dendrimeric polymers generally have low solution and melt viscosities, high chemical reactivity due to surface functionality, and enhanced solubility even at higher molecular weights. Some non-limiting examples of suitable decomposable hyper-branched polymers and dendrimers are provided in "Comprehensive Polymer Science", $2^{nd}$ Supplement, Aggarwal, pp. 71-132 (1996) which is incorporated herein by reference in its entirety.

The pore-former within the film-forming mixture may also be a polyoxyalkylene compound such as polyoxyalkylene non-ionic surfactants, polyoxyalkylene polymers, polyoxyalkylene copolymers, polyoxyalkylene oligomers, or combinations thereof. An example of such is a polyalkylene oxide that includes an alkyl moiety ranging from $C_2$ to $C_6$ such as polyethylene oxide, polypropylene oxide, and copolymers thereof.

In certain embodiments of the present invention, a single species of molecule may function as both the structure-former and pore-former within the composite film. That is, the structure-forming precursor and the pore-forming precursor are not necessarily different molecules, and in certain embodiments, the pore-former is a part of (e.g., covalently bound to) the structure-forming precursor. Examples of these materials may be found, for example, in pending U.S. patent applications Ser. Nos. 10/317,807 and 10/150,798, that are commonly assigned to the assignee of the present invention and incorporated herein by reference in its entirety. Precursors containing pore-formers bound to them are sometimes referred to hereinafter as "porogenated precursors". For example, the precursor neohexyl TMCTS may be used as both the stucture-former and pore-former precursor, whereby the TMCTS portion of the molecule forms the base OSG structure and the bulky alkyl substituent neohexyl is the pore-forming species which is removed during the anneal process. In these embodiments, the attachment of the pore-former species attached to the Si species that can network into the OSG structure may be advantageous in achieving a higher efficiency of incorporation of pore-former into the film during the deposition process. Furthermore, it may also be advantageous to have two pore-formers attached to one Si in the precursor, such as in di-neohexyl-diethoxysilane, or two Si's attached to one pore-former, such as in 1,4-bis(diethoxysilyl) cylcohexane. While not intending to be bound by theory, the reaction of one Si-pore-former bond in the plasma may enable the the incorporation of the second pore-former group into the deposited film.

In certain embodiments of the materials in which a single or multiple pore-former is attached to silicon, it may be advantageous to design the pore-former such as that when the film is cured to form the pores, a part of the pore-former remains attached to the silicon to impart hydrophobicity to the film. The pore-former in a precursor containing Si-pore-former may be chosen such that decomposition or curing leaves attached to the Si a terminal chemical group from the pore-former, such as a —$CH_3$. For example, if the pore-former neopentyl is chosen, it is believed that thermal annealing under the proper conditions may break the C—C bonds beta to the Si; it is the bond between the secondary carbon adjacent to Si and the quaternary carbon of the t-butyl group that may be thermodynamically most favorable to break. Under proper conditions, it is believed that this would leave a terminal —$CH_3$ group bonded to the Si, as well as provide hydrophobicity and a low dielectric constant to the film. Examples of such precursors include neopentyl triethoxysilane, neopentyl diethoxy silane, and neopentyl diethoxymethylsilane.

In certain embodiments of the present invention, a chemical reagent such as a reducing agent may be added to the environment during the pore-former removal process. The chemical reagent may be added to enhance the removal of the one or more pore-forming materials from the composite film.

The composite film is exposed to one or more energy sources to remove at least a portion, or more preferably substantially remove, the pore-forming material and provide the porous film. In certain preferred embodiments, the amount of the pore-forming material that remains within the porous film compared to the composite film is about 5 percent by weight or less, preferably about 1 percent by weight or less, and more preferably about 0.5 weight percent or less, as determined by FTIR, XPS, and the like. The energy source for the exposing step may include, but not be limited to, $\alpha$-particles, $\beta$-particles, $\gamma$-rays, x-rays, high energy electron, electron beam sources of energy; ultraviolet (wavelengths from 10 nm to 400 nm), visible (wavelengths from 400 to 750 nm), infrared (wavelengths from 750 to 105 nm), microwave (frequency>109 Hz), radio-frequency (frequency>106 Hz), or mixtures thereof. While not intending to be bound by theory, the composite film may absorb the energy from the one or more energy sources which may be used to enable the removal of the pore forming material or materials that contain bonds such as C—C, C—H, or C=C. The porous film may be substantially comprised of the remaining structure-forming material(s) from the composite film. The composition of the resultant porous film may be generally the same as the composition of the structure-forming material in the composite film prior to exposure to one or more energy sources.

In certain preferred embodiments, the exposure step is conducted in a non-oxidizing atmosphere such as an inert atmosphere (e.g., nitrogen, helium, argon, etc.), a reducing atmosphere (e.g., $H_2$, CO), or vacuum. It is believed that the presence of oxygen during the exposure step may raise the dielectric constant of the film.

In embodiments wherein the energy source comprises ultraviolet light, the composite film may be exposed to one or more specific wavelength within the source or a broad spectrum of wavelengths. For example, the composite film may be exposed to one or more particular wavelengths of light such as through a laser and/or optically focused light source. In the latter embodiments, the radiation source may be passed through optics such as lenses (e.g., convex, concave, cylindrical, elliptical, square or parabolic lenses), filters (e.g., RF filter), windows (e.g., glass, plastic, fused silica, synthetic silica, silicate, calcium fluoride, lithium fluoride, or magnesium fluoride windows) or mirrors to provide specific and focused wavelengths of light. In these embodiments, a non-reactive gas may be flowed over the optics during at least a portion of the exposing step to prevent the formation of build-up on the surface of the optics formed by off-gassing during the pore-formation step. Alternatively, the radiation source does not pass through any optics.

Specific temperature and time durations for the exposure step may vary depending upon the chemical species used to comprise the composite materials within the mixture. In certain preferred embodiments, the exposure step is conducted at a temperature below about 425° C., preferably below about 300° C., and more preferably below about 250° C. The exposure step is conducted for a time of about 60 minutes or less, preferably about 10 minutes or less, and more preferably about 10 seconds or less.

The exposure step may be conducted in a variety of settings depending upon the process used to form the composite film. It may be advantageous for the exposure step to be conducted after or even during at least a portion of the composite film formation step. The exposure step can be performed in various settings such as, but not limited to, a quartz vessel, a modified deposition chamber, a conveyor belt process system, a hot plate, a vacuum chamber, a cluster tool, a single wafer instrument, a batch processing instrument, or a rotating turnstile.

In certain preferred embodiments, the one or more energy sources comprise an ultraviolet light source. The temperature that the substrate is subjected to during exposure to an ultraviolet light source typically ranges from between 200 to 400° C. The composite film may be exposed to one or more wavelengths within the ultraviolet spectrum or one or more wavelengths within the ultraviolet spectrum such as deep ultraviolet light (i.e., wavelengths of 280 nm or below) or vacuum ultraviolet light (i.e., wavelengths of 200 nm or below). The ultraviolet light may be dispersive, focused, continuous wave, pulsed, or shuttered. Sources for the ultraviolet light include, but are not limited to, an excimer laser, a barrier discharge lamp, a mercury lamp, a microwave-generated UV lamp, a laser such as a frequency doubled or frequency tripled laser in the IR or visible region, or a two-photon absorption from a laser in the visible region, or a picosecond or sub-picosecond laser. The ultraviolet light source may be placed at a distance that ranges from 50 milli-inches to 1,000 feet from the composite film.

Figure 9:
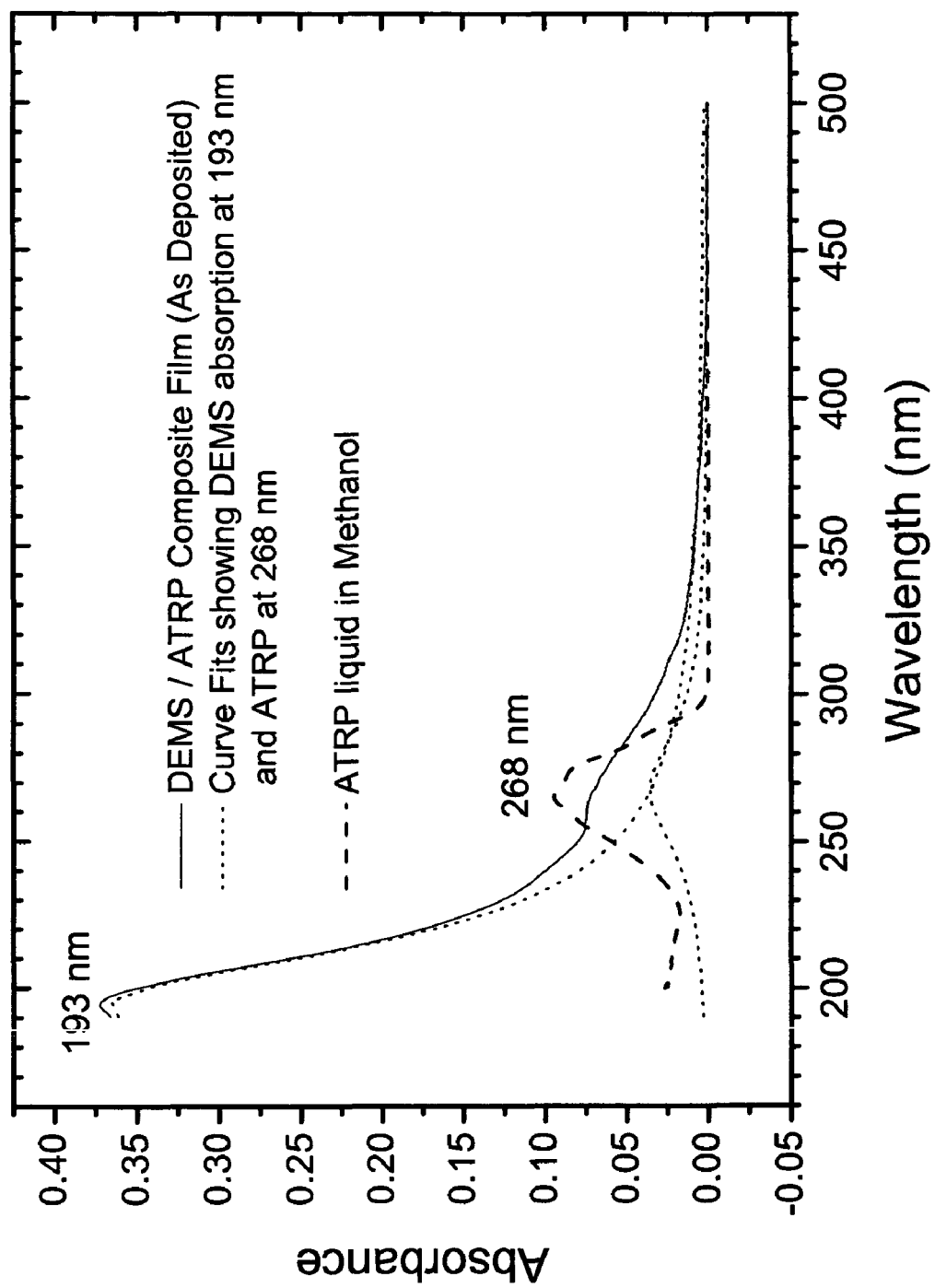
FIG. 9 provides the UV/V absorption spectrum of the as-deposited porous OSG glass film deposited using a DEMS structure-former precursor and an ATRP pore-former precursor and the UV/V absorption spectrum of an ATRP liquid.

In certain preferred embodiments, the ultraviolet light source is passed through optics to keep the temperature of the substrate relatively low during the exposing step by adjusting the ultraviolet light to a particular wavelength. For example, FIG. 9 provides the UV/visible light absorption spectrum of an as-deposited film deposited from a DEMS structure-former precursor and an ATRP pore-former precursor and the UV/visible light absorption spectrum of an ATRP liquid. The spectrum shows a peak at a wavelength of 265 nm, which relates to the presence of C—C bonds within the film. Providing a focused UV light source in the 265 nm wavelength range may remove the ATRP pore-former in less time and at a lower substrate temperature.

The porous film of the present invention may be further subjected to treatment steps, such as treating the porous film with one or more second energy sources. This treatment step may be performed before, during, or after the exposing step. The treatment step may increase the mechanical integrity of the material by, for example, promoting cross-linking within the porous film, stabilize the porous film, and/or remove additional chemical species from the network rather than forming pores. The one or more second energy sources can include any of the energy sources disclosed herein as well as thermal sources such as a hot plate, oven, furnace, RTA (rapid thermal annealing), infrared radiation sources, and the like.

The conditions under which the treatment step is conducted can vary greatly. For example, the treatment step can be conducted under high pressure or under a vacuum ambient. The environment can be inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.) or reducing (dilute or concentrated hydrogen, hydrocarbons (saturated, unsaturated, linear or branched, aromatics), etc.). The pressure is preferably about 1 Torr to about 1000 Torr, more preferably atmospheric pressure. However, a vacuum ambient is also possible for thermal energy sources as well as any other post-treating means. The temperature is preferably 200-500° C., and the temperature ramp rate is from 0.1 to 100° C./min. The total treatment time is preferably from 0.01 min to 12 hours.

In certain preferred embodiments, the treatment step is conducted using thermal energy prior to and/or during at least a portion of the UV exposure step. In these embodiments, the mechanical properties of the film may be substantially increased in comparison to thermal annealing and/or UV exposure alone.

In another embodiment of the present invention, the treatment step may be conducted using UV light. This treatment step differs from the UV exposure step in that the exposure step substantially removes the pore-former material from the organosilicate film to provide a porous film and the treatment step may, for example, improve the mechanical properties of the film such as hardness and modulus. For example, the UV exposure step may occur for a duration ranging from about 0.1 to about 5 minutes, preferably about 0.1 to about 1 minute to substantially remove the pore-former material contained therein and provide the porous OSG film; the UV treatment step may occur thereafter for a duration ranging from about 1 to about 20 minutes, preferably about 5 to about 20 minutes. Both UV exposure and UV treatment steps may be conducted using the same lamp, purge gas chemistry, and/or chamber to improve process throughput. In these embodiments, further post-treatment steps, such as treatment with other energy sources and/or chemical treatments, may also be conducted.

Figure 2:
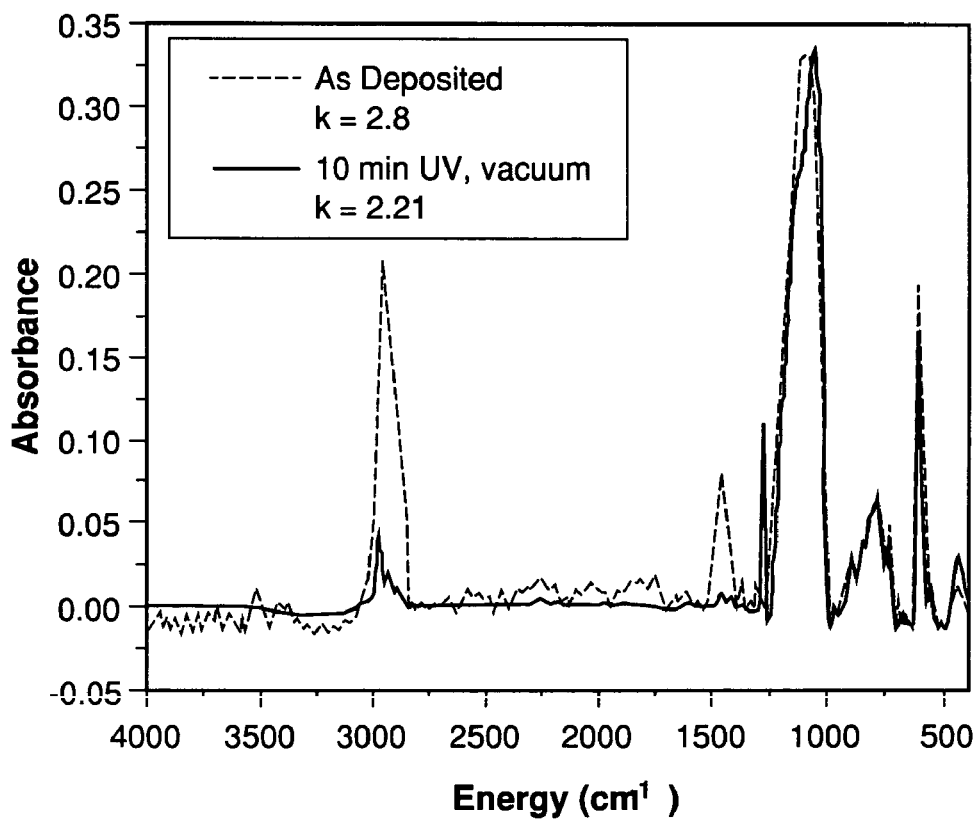
FIG. 2 provides an infrared spectrum of one embodiment of the film of the present invention wherein the pore-forming material of the film is alpha-terpenine (ATRP) and the exposure to UV radiation energy is conducted in a non-oxidizing environment.

In certain preferred embodiments, the as-deposited composite film has substantially little to no Si—OH bonds after deposition as well as substantially little to no Si—OH bonds after exposure to UV light to remove the pore-former material contained therein to provide the porous film. In these embodiments, the porous film does not exhibit a peak at 3300-3600 $cm^{-1}$ in the IR region of the spectrum. FIG. 2 illustrates that there is substantially no Si—OH bonds present in the film prior to or after deposition because there is no apparent peak at the 3300-3600 $cm^{-1}$ portion of the spectrum.

In certain embodiments of the present invention, the porous film may be subjected to a chemical treatment to enhance the properties of the final material. Chemical treatment of the porous film may include, for example, the use of fluorinating (HF, $SiF_4$, $NF_3$, $F_2$, $COF_2$, $CO_2F_2$, etc.), oxidizing ($H_2O_2$, $O_3$, etc.), chemical drying, methylating, or other chemical treatments. Chemicals used in such treatments can be in solid, liquid, gaseous and/or supercritical fluid states. In certain embodiments, supercritical fluid treatment may be used to treat the film. The fluid can be carbon dioxide, water, nitrous oxide, ethylene, $SF_6$, and/or other types of chemicals. Other chemicals can be added to the supercritical fluid to enhance the process. The chemicals can be inert (e.g., nitrogen, $CO_2$, noble gases (He, Ar, Ne, Kr, Xe), etc.), oxidizing (e.g., oxygen, ozone, nitrous oxide, etc.), or reducing (e.g., dilute or concentrated hydrocarbons, hydrogen, etc.). The temperature is preferably ambient to 500° C. The chemicals can also include larger chemical species such as surfactants. The total exposure time is preferably from 0.01 min to 12 hours.

In embodiments wherein the film is subjected to a plasma, the plasma is conducted under the following conditions: the environment can be inert (nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.), or reducing (e.g., dilute or concentrated hydrogen, hydrocarbons (saturated, unsaturated, linear or branched, aromatics), etc.). The plasma power is preferably 0-5000 W. The temperature preferably ranges from ambient to 500° C. The pressure preferably ranges from 10 mtorr to atmospheric pressure. The total treatment time is preferably 0.01 min to 12 hours.

Photocuring for selective removal of the pore-forming material and/or perfecting the lattice structure of the film is conducted under the following conditions: the environment can be inert (e.g., nitrogen, $CO_2$, noble gases (He, Ar, Ne, Kr, Xe), etc.), or reducing (e.g., dilute or concentrated hydrocarbons, hydrogen, etc.). The temperature is preferably ambient to 500° C. The power is preferably 0 to 5000 W. The wavelength is preferably IR, visible, UV or deep UV (wavelengths<200 nm). The total curing time is preferably 0.01 min to 12 hours.

Microwave post-treatment for selective removal of the pore-forming material and/or perfecting the lattice structure of the film is conducted under the following conditions: the environment can be inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.), or reducing (e.g., dilute or concentrated hydrocarbons, hydrogen, etc.). The temperature is preferably ambient to 500° C. The power and wavelengths are varied and tunable to specific bonds. The total curing time is preferably from 0.01 min to 12 hours.

Electron beam post-treatment for selective removal of pore-formers or specific chemical species from an organosilicate film and/or improvement of film properties is conducted under the following conditions: the environment can be vacuum, inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.), or reducing (e.g., dilute or concentrated hydrocarbons, hydrogen, etc.). The temperature is preferably ambient to 500° C. The electron density and energy can be varied and tunable to specific bonds. The total curing time is preferably from 0.001 min to 12 hours, and may be continuous or pulsed. Additional guidance regarding the general use of electron beams is available in publications such as: S. Chattopadhyay et al., Journal of Materials Science, 36 (2001) 4323-4330; G. Kloster et al., Proceedings of IITC, Jun. 3-5, 2002, SF, CA; and U.S. Pat. Nos. 6,207,555 B1, 6,204,201 B1 and 6,132,814 A1.

The films of the invention are porous. Total porosity of the film may be from 5 to 75% depending upon the process conditions and the desired final film properties. The average sizes within the porous film ranges from about 1 Å to about 500 Å, preferably from about 1 Å to about 100 Å, and most preferably from about 1 Å to about 50 Å. It is preferred that the film have pores of a narrow size range and that the pores are homogeneously distributed throughout the film. However, the porosity of the film need not be homogeneous throughout the film. In certain embodiments, there is a porosity gradient and/or layers of varying porosities. Such films can be provided by, e.g., adjusting the ratio of pore-forming precursor to structure-forming precursor during formation of the composite film. The porosity of the films may have continuous or discontinuous pores.

The porous films of the invention preferably have a density of less than 2.0 g/$cm^3$, or alternatively, less than 1.5 g/$cm^3$ or less than 1.25 g/$cm^3$. Preferably, the porous films of the invention have a density at least 10% less, preferably at least 25% less, and more preferably at least 50% less than the density of the unexposed, composite film.

The porous films of the invention have a lower dielectric constant relative to common OSG materials. Preferably, porous films of the invention have a dielectric constant of about 2.7 or below, preferably about 2.4 or below, and more preferably about 2.2 or below.

In certain embodiments the films of the invention are thermally stable, with good chemical resistance. In particular, the films after the exposure step have an average weight loss of less than 1.0 wt %/hr isothermal at 425° C. under $N_2$.

The films are suitable for a variety of uses. The films are particularly suitable for deposition on a semiconductor substrate, and are particularly suitable for use as, e.g., an insulation layer, an interlayer dielectric layer and/or an intermetal dielectric layer. The films can form a conformal coating. The properties exhibited by these films make them particularly suitable for use in Al subtractive technology and Cu damascene or dual damascene technology.

The films are compatible with chemical mechanical planarization (CMP) and anisotropic etching, and are capable of adhering to a variety of materials, such as silicon, $SiO_2$, $Si_3N_4$, OSG, FSG, silicon carbide, hydrogenated silicon carbide, silicon nitride, hydrogenated silicon nitride, silicon carbonitride, hydrogenated silicon carbonitride, boronitride, antireflective coatings, photoresists, organic polymers, porous organic and inorganic materials, metals such as copper and aluminum, and diffusion barrier layers such as but not limited to TiN, Ti(C)N, TaN, Ta(C)N, Ta, W, or WN.

The dielectric material and film of the present invention exhibit a substantial uniformity in composition. Compositional uniformity describes a film wherein the composition is relatively uniform with relatively little deviation in composition from the surface to the base of the film. A film that exhibits substantial uniformity in composition may avoid problems associated with the formation of a "skin layer". For example, the use of UV light or electron beams during the exposing and/or treating steps may form a "skin layer" that is compositionally different than the underlying bulk film because the radiation sufficient to remove the pore-former precursor within the composite film only passes through the surface of the film. Further, the removal of the pore-former material near the surface or base of the film can cause integration problems within the device due to a thickness-dependent dielectric constant and hardness for the resulting porous dielectric material.

To enable comparisons, the result can be expressed as percent non-uniformity. Preferably, the percent non-uniformity is about 10% or less, more preferably about 5% or less, most preferably about 2% or less. Compositional uniformity can be determined, for example, by using electrical measurements (e.g., 4-point probe), SIMS (Secondary Ion Mass Spectrometry), RBS (Rutherford Backscattering Spectroscopy), Spectroscopic Ellipsometry and/or high resolution X-ray diffractometry (HR-XRD).

Compositional uniformity is preferably measured using SIMS across a wafer substrate onto which the OSG film has been deposited. In one preferred method, SIMS measurements are made through the depth of the film. For each element in question, the distribution of that element through the film is then determined from the SIMS data, and the resulting value expressed in intensity measured at a detector, which is related to its concentration in the film at any given depth. The values are then averaged, and the standard deviation determined.

For a given OSG film, compositional non-uniformity may be compared using the standard deviation divided by the sum of the maximum and minimum measured values, and the result expressed as a percentage. For example, if a dynamic SIMS depth of profile is performed at a single point for a given OSG film and the average intensity of the carbon signal is $1.255 \times 10^6$ counts with a standard deviation of $1.987 \times 10^4$ counts, and the minimum intensity throughout the film is $1.21 \times 10^6$ counts and the maximum intensity is $1.3 \times 10^6$ counts, then the compositional non-uniformity is 0.8% because the sum of the minimum and maximum values is $1.51 \times 10^6$, the standard deviation is $1.987 \times 10^4$, and $1.987 \times 10^4$ divided by $1.51 \times 10^6$ equals 0.8%.

Preferred values of compositional non-uniformity may vary depending on the amount of the element in the OSG film. If the amount of element is 1 atomic % or greater, the compositional non-uniformity for the Si-containing film is about 15% or less, more preferably about 10% or less, even more preferably about 5% or less, most preferably about 1% or less. Therefore, the compositional non-uniformity of the major elements within the OSG film, i.e., silicon, oxygen, hydrogen, and carbon is 15% or less, more preferably 10% or less, and most preferably 5% or less.

The present invention also discloses a mixture for forming a porous OSG film having a dielectric constant of 3.5 or below suitable for exposure to UV light. The OSG film may be formed by a variety of deposition processes including CVD-related and spin-on-glass processes. The mixture may comprise from 5% to 95% by weight of a structure-former precursor and from 5% to 95% by weight of a pore-former. Depending upon the deposition process, such as for spin-on-glass deposition, the mixture may comprise additional additives, for example, a solvent, a catalyst, a surfactant, water, and the like.

Although the invention is particularly suitable for providing films and products of the invention are largely described herein as films, the invention is not limited thereto. Products of the invention can be provided in any form such as coatings, multilaminar assemblies, and other types of objects that are not necessarily planar or thin, and a multitude of objects not necessarily used in integrated circuits. Preferably, the substrate is a semiconductor.

The invention will be illustrated in more detail with reference to the following examples, but it should be understood that the present invention is not deemed to be limited thereto.

EXAMPLES

The sample films were formed via a plasma enhanced CVD process using an Applied Materials Precision-5000 system in a 200 mm D×Z vacuum chamber that was fitted with an Advance Energy 200 rf generator and using an undoped TEOS process kit. The CVD process involved the following basic steps: initial set-up and stabilization of gas flows deposition, and purge/evacuation of chamber prior to wafer removal.

The thickness and refractive index of each film were measured on an SCI Filmtek 2000 Reflectometer. Dielectric constants were determined using Hg probe technique on low resistivity p-type wafers (<0.02 ohm-cm). Mechanical properties were determined using MTS Nano Indenter.

In some of the following examples, UV exposure was performed using a Fusion UV model F305 ultraviolet lamp and a P300 power supply, an I300MB irradiator unit and a "D" bulb. The distance between the face of the irradiator unit and the sample is approximately 3 inches. The samples were contained within a 2" diameter quartz glass process tube with sealed end caps and subjected to either a vacuum or a nitrogen purge. In examples involving a vacuum or inert atmospheres, three pump and purge cycles were performed prior to UV exposure to ensure that any oxygen present was removed from the process tube. Exposure times varied between 0 and 30 minutes.

Comparative Example A

DEMS Film Having ATRP as Pore-Former Subjected to Thermal Curing

A composite film formed via PECVD of diethoxy methylsilane (DEMS) as the structure-forming precursor and alpha-terpinene (ATRP) as the pore-forming precursor and carbon dioxide carrier gas had the following properties before thermal curing: thickness of 1034 nm, dielectric constant of 2.8, and refractive index of 1.509. The film was heated in a tube furnace to 425° C. for 4 hours at ambient pressure under 2 slpm nitrogen purge. After thermal curing, the thickness was 825 nm and the refractive index was 1.355. The dielectric constant was 2.21. The film properties before and after thermal curing are described in Table 1.

Example 1

DEMS Film Having ATRP as Pore-Former Subjected to UV Exposure

A composite film formed via plasma enhanced chemical vapor codeposition (PECVD) of diethoxy methylsilane as the structure-forming precursor and ATRP as the pore-forming precursor and carbon dioxide as carrier gas had the following properties before UV exposure: thickness of 1018 nm, dielectric constant of 2.8, and refractive index of 1.509. The film was exposed to UV light at a pressure of 5 millitorr for 10 minutes. The thickness after UV exposure was 790 nm, and the refractive index was 1.363. The dielectric constant was 2.21.

FIG. 2 displays an infrared spectra of the film before (see dashed line) and after (see solid line) UV exposure, indicating reduced absorption in the C—H and C═C regions of the spectrum following UV exposure. The reduced absorption in these regions of the spectrum indicates that the pore-forming precursor, or ATRP, is substantially removed as a result of the UV exposure. The film properties both before and after UV exposure are described in Table 1.

Example 1 illustrates that a 10 minute exposure to UV light under vacuum can effect the same changes in film properties as a 4 hour thermal curing step conducted under ambient nitrogen in Comp. Ex. A. The milder processing conditions and shorter time duration needed to achieve the same final film properties could substantially decrease the process time and energy necessary for semiconductor processing.

Example 2

DEMS Film Having ATRP as Pore-Former Subjected to UV Exposure and Post-UV Exposure Thermal Treatment A composite film formed via plasma enhanced chemical vapor codeposition (PECVD) of diethoxy methylsilane as the structure-forming precursor and ATRP as the pore-forming precursor and carbon dioxide as carrier gas had the following properties before UV exposure: thickness of 1008 nm, a dielectric constant of 2.8, and a refractive index of 1.504. The film was exposed to UV light at a pressure of 5 millitorr for 10 minutes. The thickness after curing was 847 nm, and the refractive index was 1.369.

The dielectric constant was 2.25. The film was then heated in a tube furnace to 425° C. for 90 minutes at ambient pressure under nitrogen purge. The thickness after thermal curing was 800 nm, and the refractive index was 1.359. The dielectric constant was 2.24. The film properties before and after thermal treatment are described in Table 1.

Example 2 illustrates that the UV exposure step may stabilize the film for subsequent thermal or other treatments. There was substantially no change in the dielectric constant or refractive index of the film when a UV-exposed film was heated to 425° C. for 90 minutes under nitrogen. While there is some thickness loss from the film, this loss did not affect the overall film properties such as dielectric constant or refractive index.

Comparative Example B

DEMS Film Having ATRP as Pore-Former Subjected to UV Exposure in an Air Atmosphere A composite film formed via plasma enhanced chemical vapor codeposition (PECVD) of diethoxy methylsilane as the structure-forming precursor and ATRP as the pore-forming precursor and carbon dioxide as carrier gas had the following properties before UV exposure: thickness of 720 nm, a dielectric constant of 2.8, and a refractive index of 1.510. The film was exposed to UV light at ambient pressure under air (approximately 21% oxygen) for 5 minutes. The thickness after UV exposure was 640 nm, and the refractive index was 1.525. The dielectric constant was 4.80.

Figure 3:
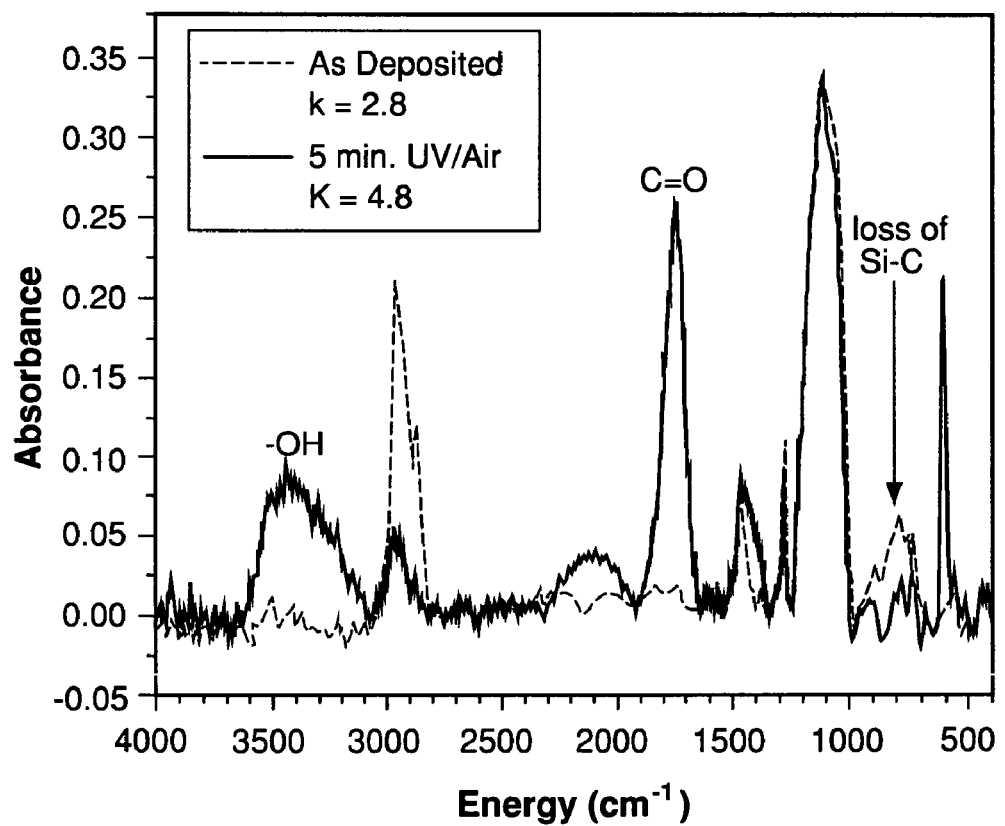
FIG. 3 provides an infrared spectrum of a comparative film wherein the pore-forming material of the film is ATRP and the exposure to UV radiation energy is conducted in an oxidizing environment.

FIG. 3 displays infrared spectra of the film before (dashed line) and after (solid line) UV exposure, indicating the elimination of Si—C bonds from the film and the formation of —OH and C═O groups within the film. The film properties before and after exposure are described in Table 1.

Comp. Ex. B illustrates that, in certain instances, UV exposure of low dielectric films under air or oxygen containing atmosphere may lead to deleterious effects such as water sorption and the formation of C═O and —OH groups within the films. These groups, unfortunately, may raise the dielectric constant of the film as evidenced by the increase in dielectric constant from 2.8 to 4.8. Comparing Comp. Ex. B. with Example 1, Example 1 may avoid the possibility of C═O and —OH group formation by UV exposure in a non-oxidizing atmosphere and the dielectric constant of the film is lowered rather than increased.

Comparative Example C

DEMS Film Having 5-dimethyl-1,4-cyclooctadiene as Pore-former Subjected to Thermal Curing A composite film formed via PECVD having diethoxy methylsilane as the structure-forming precursor, 2,5-dimethyl-1,4-cyclooctadiene as the pore-forming precursor, and carbon dioxide as the carrier gas had the following properties before thermal curing: thickness of 1027 nm, dielectric constant of 2.8, and refractive index of 1.484. The film was heated in a tube furnace to 425° C. for 4 hours at ambient pressure under 2 slpm nitrogen purge. After thermal curing the thickness was 894 nm, and the refractive index was 1.364. The dielectric constant was 2.43. The film properties before and after thermal curing are described in Table 1.

Example 3

DEMS Film Having 5-dimethyl-1,4-cyclooctadiene as Pore-former Subjected to UV Exposure A composite film formed via PECVD having diethoxy methylsilane as the structure-forming precursor, 2,5-dimethyl-1,4-cyclooctadiene as the pore-forming precursor, and carbon dioxide as the carrier gas had the following properties before UV exposure: thickness of 934 nm, dielectric constant of 2.8, and refractive index of 1.484. The film was exposed to UV light at a pressure of 5 millitorr for 20 minutes. The thickness after UV exposure was 809 nm, and the refractive index was 1.352. The dielectric constant was 2.52. The film properties both before and after UV exposure are described in Table 1.

Example 3 establishes that the UV exposure step like a thermal curing step (see Comp. Ex. C) may reduce the dielectric constant and refractive index of the composite film by removing the pore-forming material within the composite film. However, the milder process conditions and shorter time needed to achieve the similar final film properties could substantially decrease the process time and energy necessary for semiconductor processing.

Comparative Example D

DEMS Film Having Decahydronaphthalene Pore-Former Subjected to Thermal Curing

A muliphasic film formed via PECVD of diethoxy methylsilane as the structure-forming precursor, decahydronaphthalene as the pore-forming precursor, and carbon dioxide carrier gas had the following properties before thermal curing: thickness of 493 nm, dielectric constant of 2.65, and refractive index of 1.490. The film was heated in a tube furnace to 425° C. for 4 hours at ambient pressure under 2 slpm nitrogen purge. After thermal curing the thickness after thermal curing was 438 nm, and the refractive index was 1.334. The dielectric constant was 2.20. The film properties both before and after thermal curing are described in Table 1.

Example 4

DEMS Film Having Decahydronaphthalene Pore-Former Subjected to UV Exposure

A muliphasic film formed via PECVD of diethoxy methylsilane as the structure-forming precursor, decahydronaphthalene as the pore-forming precursor, and carbon dioxide carrier gas had the following properties before UV exposure: thickness of 474 nm, dielectric constant of 2.65, and refractive index of 1.490. The film was exposed to UV light at a pressure of 5 millitorr for 20 minutes. The thickness after UV exposure was 375 nm, and the refractive index was 1.333. The dielectric constant was 2.33. The film properties both before and after UV exposure are described in Table 1.

Example 4 establishes that a UV exposure step for 20 minutes under vacuum can effect the similar changes in film properties as a 240 minute thermal curing step under ambient nitrogen for the same compound used as the pore-forming material (see Comp. Ex. D). However, the milder conditions and shorter time needed to achieve the similar final film properties could substantially decrease the process time and energy necessary for semiconductor processing.

Comparative Example E

DEMS Film Having Ethylbenzene as Pore-Former Subjected to Thermal Curing

A composite film formed via PECVD of diethoxy methylsilane as the structure-forming precursor, ethylbenzene as the pore-forming precursor, and carbon dioxide carrier gas had the following properties before thermal curing: thickness of 612 nm, dielectric constant of 2.75, and refractive index of 1.495. The film was heated in a tube furnace to 425° C. for 4 hours at ambient pressure under 2 slpm nitrogen purge. After thermal curing the thickness after thermal curing was 511 nm, and the refractive index was 1.352. The dielectric constant was 2.38. The film properties both before and after thermal curing are described in Table 1.

Example 5

DEMS Film Having Ethylbenzene as Pore-Former Subjected to UV Exposure

A composite film formed via PECVD of diethoxy methylsilane as the structure-forming precursor, ethylbenzene as the pore-forming precursor, and carbon dioxide carrier gas had the following properties before UV exposure: thickness of 586 nm, dielectric constant of 2.75, and refractive index of 1.495. The film was exposed to UV light at a pressure of 5 millitorr for 20 minutes. The thickness after UV exposure was 529 nm, and the refractive index was 1.398. The dielectric constant was 2.31. The film properties both before and after UV exposure are described in Table 1.

Example 5 establishes that the UV exposure step like a thermal curing step (see Comp. Ex. E) may reduce the dielectric constant and refractive index of the composite film by removing at least a portion of the pore-forming material within the composite film. However, the milder process conditions and shorter time needed to achieve the similar final film properties could substantially decrease the process time and energy necessary for semiconductor processing.

Comparative Example F

DEMS Film Having Limonene as Pore-former Subjected to Thermal Curing

A composite film formed via PECVD having diethoxy methylsilane as the structure-forming material, limonene as the pore-forming material, and carbon dioxide as the carrier gas had the following properties before thermal curing: thickness of 554 nm, dielectric constant of 2.58, and refractive index of 1.529. The film was heated in a tube furnace to 425° C. for 4 hours at ambient pressure under 2 slpm nitrogen purge. After thermal curing the thickness after UV exposure was 297 nm, and the refractive index was 1.453. The dielectric constant was 2.56. The film properties both before and after thermal curing are described in Table 1.

Example 6

DEMS Film Having Limonene as Pore-former Subjected to UV Exposure

A composite film formed via PECVD having diethoxy methylsilane as the structure-forming material, limonene as the pore-forming material, and carbon dioxide as the carrier gas had the following properties before UV exposure: thickness of 570 nm, dielectric constant of 2.58, and refractive index of 1.529. The film was exposed to UV light at a pressure of 5 millitorr for 20 minutes. The thickness after UV exposure was 355 nm, and the refractive index was 1.472. The dielectric constant was 2.27. The film properties both before and after UV exposure are described in Table 1.

Example 6 shows that a UV exposure step for 20 minutes under vacuum can be effective to lower the dielectric constant of films where thermal curing for 240 minutes at 425° C. under nitrogen is not effective (see Comp. Ex. 6). The milder conditions and shorter time duration needed to achieve a lower dielectric constant than that obtainable by thermal curing is a significant improvement from both a performance and process viewpoint. It also demonstrates significantly that it may be possible to tailor specific pore-former species to be more reactive towards UV exposure than a thermal curing step for their removal from a composite film.

TABLE 1

Film Property Data

| Example | K | Refractive Index | Thickness | Δ Thickness (%) |
|---|---|---|---|---|
| Comp Ex. A (pre) | 2.80 | 1.51 | 1034 nm | — |
| Comp. Ex. A (post) | 2.21 | 1.36 | 825 nm | −20 |
| Ex. 1 (pre) | 2.80 | 1.51 | 1018 nm | — |
| Ex. 1 (post) | 2.21 | 1.36 | 790 nm | −22 |
| Ex. 2 (pre) | 2.80 | 1.50 | 1008 nm | — |
| Ex. 2 (post-UV) | 2.25 | 1.37 | 847 nm | −16 |
| Ex. 2 (post-UV-thermal) | 2.24 | 1.36 | 800 nm | −5.5 |
| Comp. Ex. B (pre) | 2.80 | 1.51 | 720 nm | — |
| Comp. Ex. B (post) | 4.80 | 1.53 | 640 nm | −15 |
| Comp. Ex. C (pre) | 2.80 | 1.48 | 1027 nm | — |
| Comp. Ex. C (post) | 2.43 | 1.36 | 894 nm | −13 |
| Ex. 3 (pre) | 2.80 | 1.48 | 934 nm | — |
| Ex. 3 (post) | 2.52 | 1.35 | 809 nm | −13 |
| Comp. Ex. D (pre) | 2.65 | 1.49 | 493 nm | — |
| Comp. Ex. D (post) | 2.20 | 1.33 | 438 nm | −11 |
| Ex. 4 (pre) | 2.65 | 1.49 | 474 nm | — |
| Ex. 4 (post) | 2.33 | 1.33 | 375 nm | −21 |
| Comp. Ex. E (pre) | 2.75 | 1.49 | 612 nm | — |
| Comp. Ex. E (post) | 2.38 | 1.35 | 511 nm | −17 |
| Ex. 5 (pre) | 2.75 | 1.50 | 586 nm | — |
| Ex. 5 (post) | 2.31 | 1.40 | 529 nm | −10 |
| Comp. Ex. F (pre) | 2.58 | 1.53 | 554 nm | — |
| Comp. Ex. F (post) | 2.56 | 1.45 | 297 nm | −46 |
| Ex. 6 (pre) | 2.58 | 1.53 | 570 nm | — |
| Ex. 6 (post) | 2.27 | 1.47 | 355 nm | −38 |

In summary, comparison of the IR spectrum of as-deposited composite films and the porous films after UV exposure shows that UV exposure under vacuum is successful for selective removal of carbon-carbon and carbon-hydrogen groups from the films. For example, there is seen a dramatic reduction in C—H absorptions near 3000 cm$^{-1}$ suggesting that essentially all the carbon-carbon bonds may be removed from the films. However, there is essentially no change in the Si—CH$_3$ absorption at 1275 cm$^{-1}$.

The hydrophobicity of the films after UV exposure under vacuum is substantiated by the lack of Si—OH groups in the IR spectrum. The decrease in refractive index and dielectric constants of the films after UV exposure suggests that the porous films are less dense than the composite films, despite the decrease in film thickness. This stands in contrast to the film of Comp. Ex. B that was exposed to UV radiation within an air or an oxygen-containing atmosphere. These films are unstable and show absorptions arising from —OH groups present within the film along with an increase in the dielectric constant.

Example 7 and 8

DEMS Film Having ATRP as Pore-Former Subjected to UV Exposure and Pre-UV Exposure Thermal Treatment A porous DEMS-based OSG film was deposited by PE-CVD followed by thermal anneal at 425° C. and/or UV exposure. Precursors DEMS (210 mg/min), ATRP (490 mg/min), oxygen (25 sccm), and CO$_2$ carrier gases (200 sccm) were introduced into the deposition chamber and deposited with plasma power of 600W, spacing of 350 mils and a chamber pressure of 8 torr. The wafer temperature was 300° C. The deposition rate was 240 nm/min. The film properties of the as-deposited film (example 7a), thermal annealed film (example 7b), thermal annealed then UV exposed film (example 7c), and UV exposed film (example 7d) are provided in Table 2.

A porous DEMS-based OSG film was deposited by PE-CVD followed by thermal anneal at 425° C. and/or UV exposure. Precursors DEMS (210 mg/min), ATRP (490 mg/min), oxygen (25 sccm), and CO$_2$ carrier gases (200 sccm) were introduced into the deposition chamber and deposited with plasma power of 450W, spacing of 350 mils and a chamber pressure of 6 torr. The wafer temperature was 300° C. The deposition rate was 175 nm/min. The film properties of the as-deposited film (example 8a), thermal annealed film (example 8b), thermal annealed then UV exposed film (example 8c), UV exposed film (example 8d), and UV exposed then thermal annealed film (example 8e) are provided in Table 2.

Examples 7 and 8 illustrate that thermal annealing and exposure to a UV light source can be used in sequence to improve the properties of porous OSG films to an even greater degree than UV exposure alone. In particular it should be noted that films subjected to thermal annealing alone, examples 7b and 8b, exhibited a decrease in material hardness by 14% and 11%, respectively, relative to the as-deposited films. On the other hand, the mechanical hardness of examples 7d and 8d was observed to increase by 5% and 7%, respectively, relative to the as-deposited films. Comparing examples 7b with 7d and 8b with 8d illustrates that exposure to UV radiation may be a superior method for both increasing the hardness and decreasing the dielectric constant of porous OSG films.

Examples 7c and 8c demonstrate that the use of thermal annealing and UV exposure steps in sequence can be used to enhance the material properties to an even greater degree than UV exposure alone. The results clearly show that the porous OSG material formed after thermal annealing is still susceptible to treatment by exposure to UV light to enhance its materials properties. Conversely, a film exposed to UV light is stable to thermal annealing, as evidenced by the similarity between examples 8d and 8e.

TABLE 2

Comparison of Properties of Various Porous OSG Films Before and After UV Exposure

| Example | Precursor | | Thickness Loss (5%) | Refractive Index | Dielectric Constant | Modulus (GPa) | Hardness (GPa) |
|---|---|---|---|---|---|---|---|
| 7a | DEMS/ATRP | As Deposited | N/A | 1.458 | 2.74 | 5.87 | 0.86 |
| 7b | DEMS/ATRP | Thermal | 0 | 1.350 | 2.48 | 4.89 | 0.74 |
| 7c | DEMS/ATRP | Thermal + UV | −10 | 1.354 | 2.40 | 7.42 | 1.07 |
| 7d | DEMS/ATRP | UV | −4 | 1.338 | 2.44 | 6.64 | 0.90 |
| 8a | DEMS/ATRP | As Deposited | N/A | 1. | 2.79 | 4.89 | 1.05 |

TABLE 2-continued

Comparison of Properties of Various Porous OSG Films Before and After UV Exposure

| Example | Precursor | | Thickness Loss (5%) | Refractive Index | Dielectric Constant | Modulus (GPa) | Hardness (GPa) |
|---|---|---|---|---|---|---|---|
| 8b | DEMS/ATRP | Thermal | 0 | 1.366 | 2.61 | 5.87 | 0.93 |
| 8c | DEMS/ATRP | Thermal + UV | −6 | 1.348 | 2.57 | 3.74 | 1.55 |
| 8d | DEMS/ATRP | UV | −3 | 1.339 | 2.56 | 3.17 | 1.12 |
| 8e | DEMS/ATRP | UV + Thermal | −4 | 1.331 | 2.55 | 4.73 | 1.03 |

Example 9

Deposition of Porous OSG Films Using Diethoxymethylsilane (DEMS) and Alpha-terpinene (ATRP)

Exemplary porous OSG films were formed onto a silicon wafer via PE-CVD of 210 mg/min of the structure-former precursor DEMS, 490 mg/min of the pore-former precursor ATRP, with 200 sccm of a $CO_2$ carrier gas and 25 sccm of an oxygen additive. The deposition was performed at 8 torr, 750 W plasma power, 350 mils spacing, and a liquid flow of 675 mg/min. The wafer temperature during deposition was maintained at 300° C. The deposition rate of the film was 460 nm/minute.

Figures 4A, 4B:
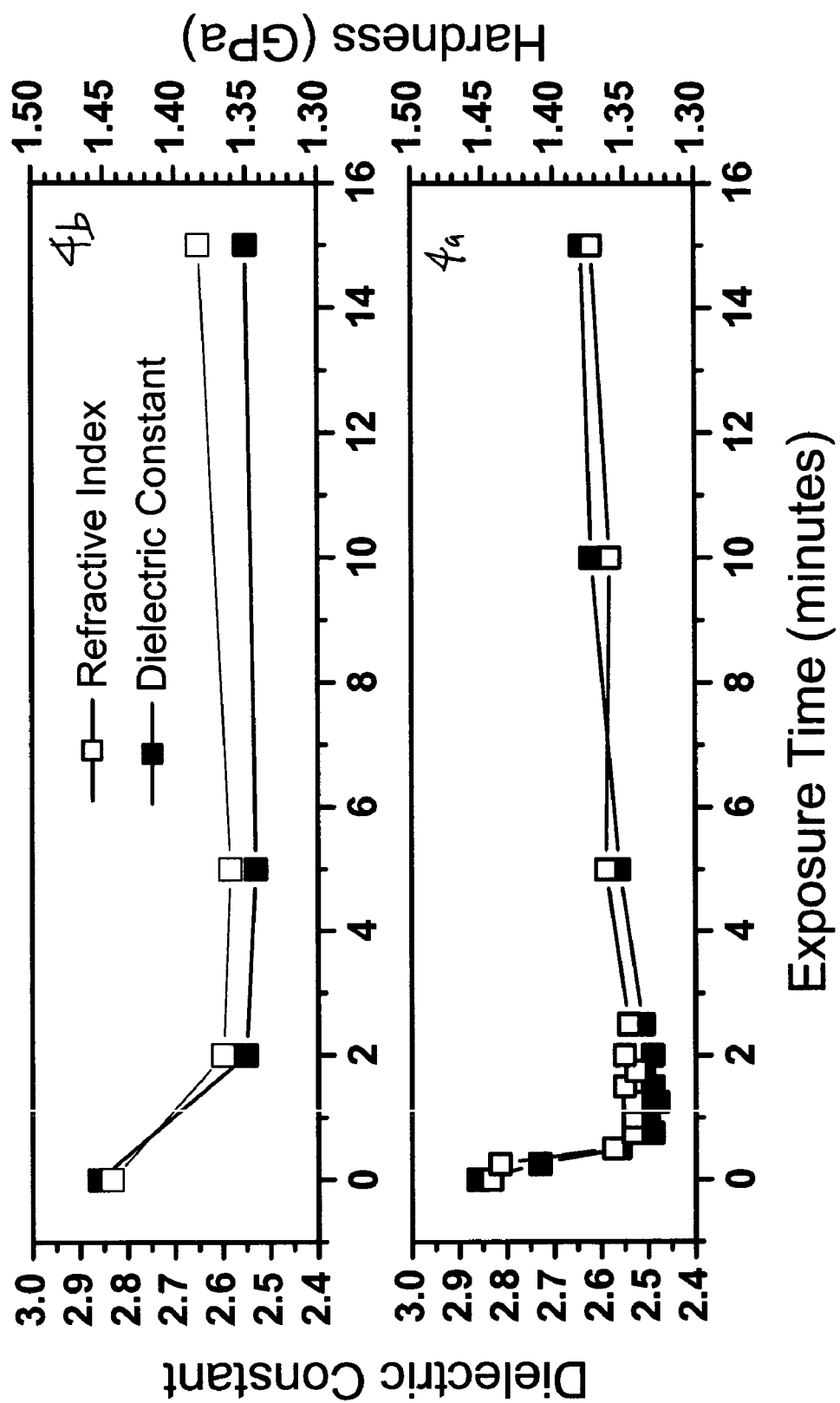
FIGS. 4a and 4b provides the dielectric constant and refractive index versus UV exposure time for films deposited using a DEMS structure-former precursor and an ATRP pore-former precursor under vacuum atmosphere (5 millitorr) and under nitrogen atmosphere, respectively.

The films were exposed to ultraviolet light under either a vacuum atmosphere of about 5 millitorr (example 9a) or under a nitrogen atmosphere having a flow rate of 800 sccm at ambient pressure (example 9b). FIGS. 4a and 4b provide the dielectric constant and refractive index versus UV exposure time for examples 9a and 9b, respectively. FIGS. 4a and 4b show that the exposure to UV light removes the pore-former precursor ATRP under either the vacuum or nitrogen atmosphere at ambient pressure within the first couple of minutes of exposure. This is shown by the drop in both dielectric constant and refractive index for both exemplary films 9a and 9b.

Figure 7:
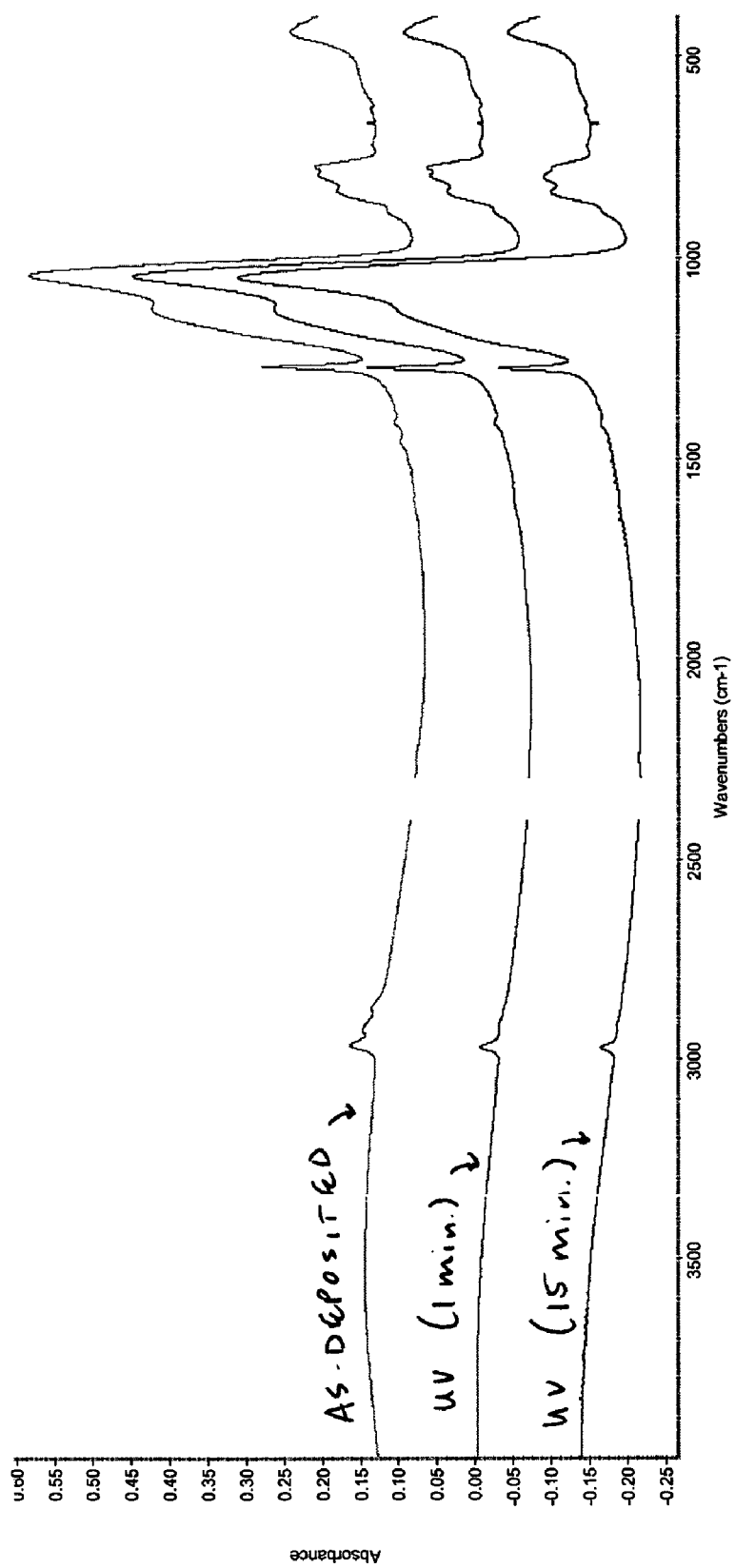
FIG. 7 provides the IR absorption spectrum for a porous OSG glass film deposited using a DEMS structure-former precursor and an ATRP pore-former precursor after deposition and after exposure to UV light in a vacuum atmosphere for 1 minute and 15 minutes.

Examination of the infrared spectra in FIG. 7 shows a dramatic decrease in the C—$H_x$ absorption region near 2900 $cm^{-1}$ after the first minute of UV exposure. However, there is noticeably little change in other regions of the spectrum after one minute of UV exposure. Further, there was observed minimal film shrinkage evident during the pore-former removal process.

Figure 5:
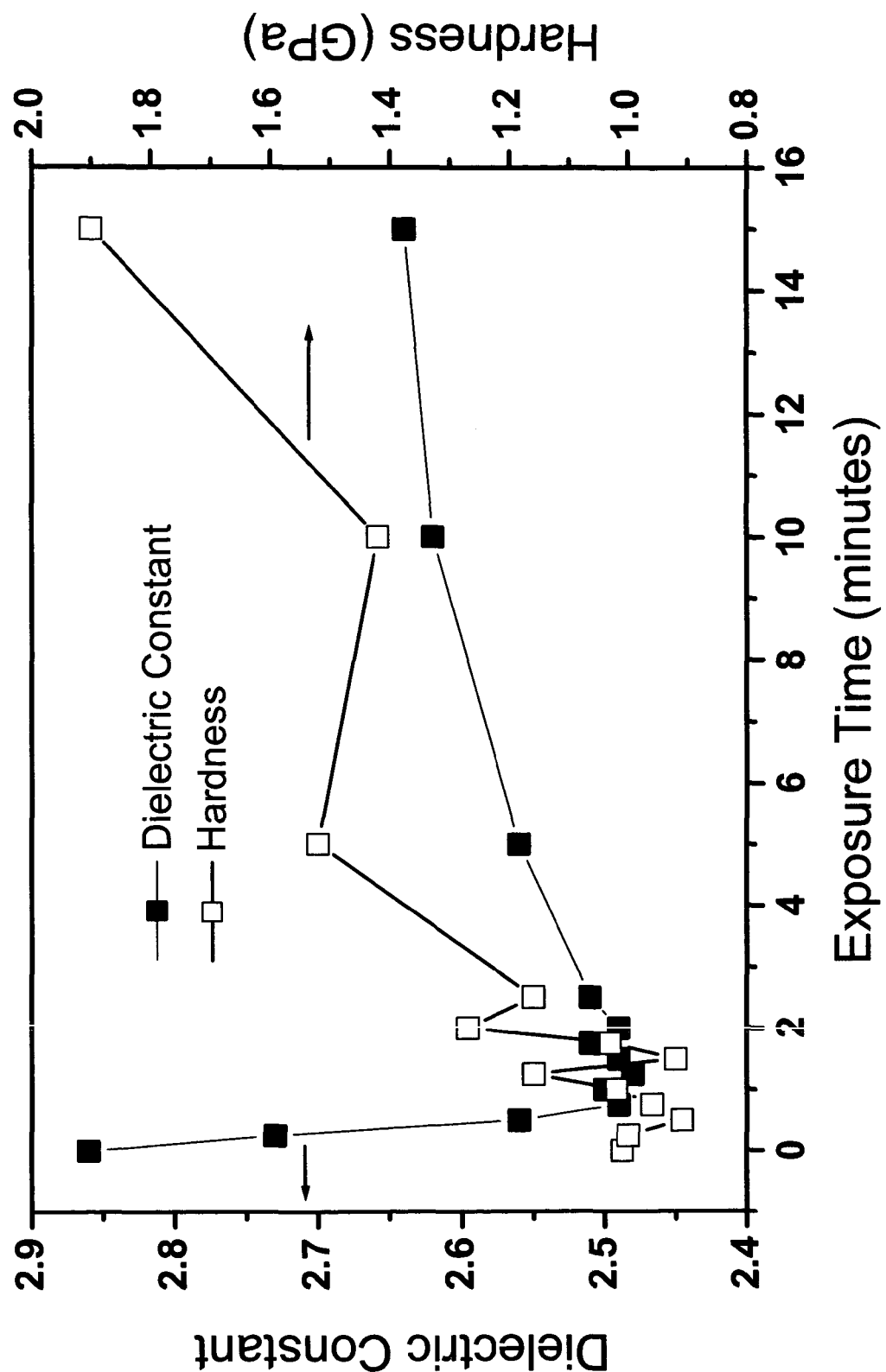
FIG. 5 provides the dielectric constant and hardness (GPa) versus UV exposure time for a film deposited using a DEMS structure-former precursor and an ATRP pore-former precursor under vacuum atmosphere (5 millitorr).

FIG. 5 and Table 3 show that the mechanical hardness of the film decreased by approximately 10% within the first couple of minutes of UV exposure in a vacuum atmosphere. It was observed that the onset of film hardening occurs under continued exposure to UV light after 2 minutes, or after removal of the pore-former precursor, and saturates after approximately 15 minutes for the lamp power and spectral output configuration.

Figure 6:
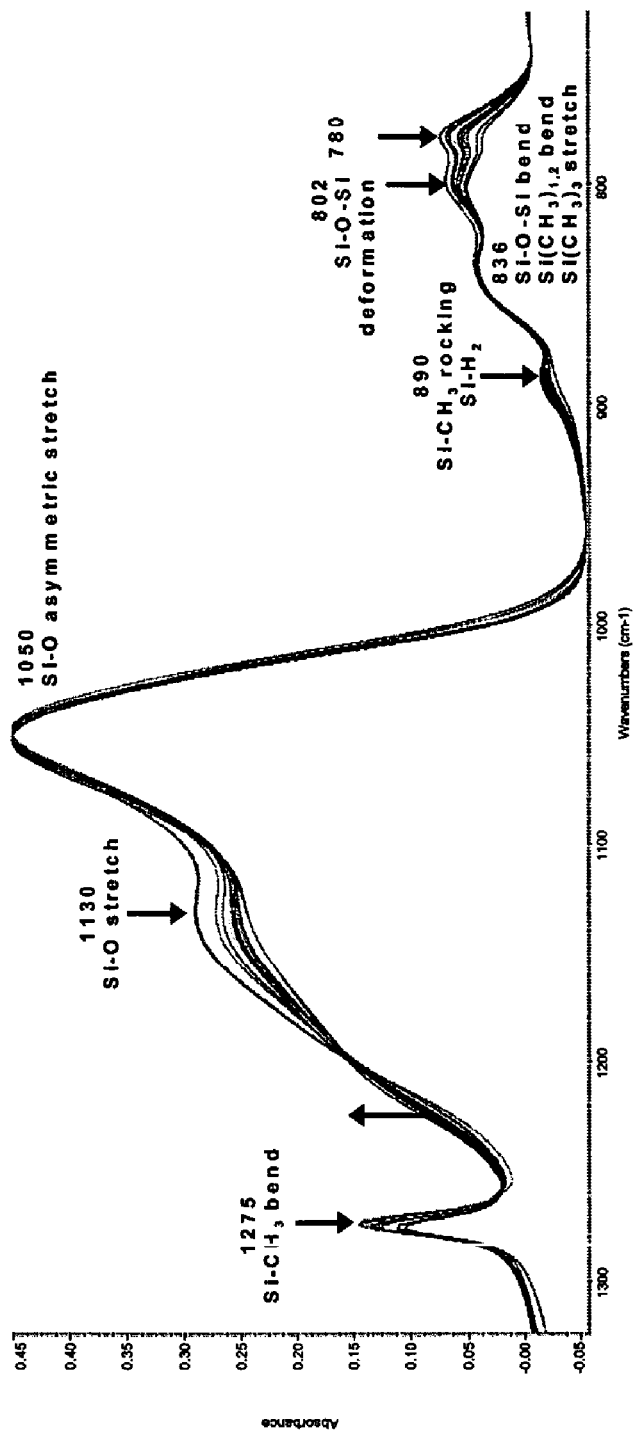
FIG. 6 illustrates the changes in the IR absorption spectrum for wavelengths ranging between 700 and 1350 1/cm for a porous OSG glass film deposited using a DEMS structure-former precursor and an ATRP pore-former precursor upon UV exposure under a vacuum atmosphere and for a duration ranging from 0 to 20 minutes.

Referring to FIGS. 6 and 7, the IR spectra also confirms evidence of the hardening process upon removal of the pore-former precursor. An evolution of the Si—O region from a double peak to a single major peak with a shoulder occurs during initial UV exposure. The two areas of the Si—O region (1130 $cm^{-1}$ and 1060 $cm^{-1}$) are typical of cage-like and networked silicate, respectively. Increase in the former may be characteristic of a silicate doped with terminal groups, whereas increases in the latter may be more typical of a highly networked oxide. The evolution of the OSG film from a cage-to-network silicate is typical for processes that increase the mechanical strength. Further, FIGS. 6 and 7 also show decreases in methyl stretching and bending modes as well as loss of Si—H.

The chemical composition determined by x-ray photoelectron spectroscopy for an exemplary OSG 9a films after 1 minute and 15 minutes exposure under vacuum are provided in Table 4. The data shows that the carbon concentration decreases by 48% within the first minute of UV exposure consistent with the loss of the pore-former precursor from the film. However, during the hardening process, there is little change in the overall composition of the film despite the 100% increase in hardness and modulus. It is believed that these increases are a result in a change to the structure of the film. Hydrogen concentration (not shown) may also decrease significantly. Consequently, it is believed that the major gas species evolved from UV exposure between 1 and 15 minutes are hydrogen-containing species.

TABLE 3

Change in film properties for Exemplary OSG film 9a deposited from DEMS and ATRP upon exposure to UV light under vacuum.

| Time (seconds) | Refractive Index | Dielectric Constant | Modulus (GPa) | Hardness (GPa) | Thickness Loss (%) |
|---|---|---|---|---|---|
| 0 | 1.444 | 2.86 | 6.91 | 1.01 | N/A |
| 15 | 1.438 | 2.73 | 6.79 | 1.00 | 0 |
| 30 | 1.358 | 2.56 | 5.88 | 0.91 | 0 |
| 45 | 1.344 | 2.49 | 6.01 | 0.96 | −1 |
| 60 | 1.344 | 2.50 | 6.29 | 1.02 | −2 |
| 75 | 1.344 | 2.48 | 7.13 | 1.16 | −3 |
| 90 | 1.350 | 2.49 | 6.29 | 0.92 | −4 |
| 105 | 1.342 | 2.51 | 6.59 | 1.03 | −4 |
| 120 | 1.350 | 2.49 | 8.11 | 1.27 | −4 |
| 150 | 1.347 | 2.51 | 7.38 | 1.16 | −4 |
| 300 | 1.363 | 2.56 | 9.47 | 1.52 | −9 |
| 600 | 1.360 | 2.62 | 8.7 | 1.42 | −9 |
| 900 | 1.373 | 2.64 | 12.2 | 1.9 | −12.5 |
| 1200 | 1.380 | 2.72 | 11.8 | 1.9 | −12.5 |

TABLE 4

Properties of DEMS/ATRP films: as-deposited, after UV exposure under vacuum for 1 minute (after generation of porosity), and after 15 minutes (after film hardening).

| | Silicon | Oxygen | Carbon | Formula |
|---|---|---|---|---|
| As-Deposited | 30.3 | 38.7 | 31.8 | $SiO_{1.27}C$ |
| 1 min. UV | 35.3 | 47.7 | 17 | $SiO_{1.34}C_{0.5}$ |
| 15 min. UV | 36.4 | 50 | 13.6 | $SiO_{1.37}C_{0.37}$ |

Example 10

Compositional Uniformity of the DEMS/ATRP OSG Films

Exemplary porous OSG films were formed onto a silicon wafer via PE-CVD as described in Example 9. Dynamic SIMS depth of profile analysis of the OSG films, as deposited and after exposure to a UV light source at 1 minute and at 15 minutes, was conducted using an cesium ion gun at 2.5 kev to determine the compositional non-uniformity of the silicon, oxygen, carbon, and hydrogen within each film through detection of negative species at various points throughout the thickness of the film. The silicon, oxygen, carbon, and hydrogen were monitored as a function of depth into the film.

Figure 8A:
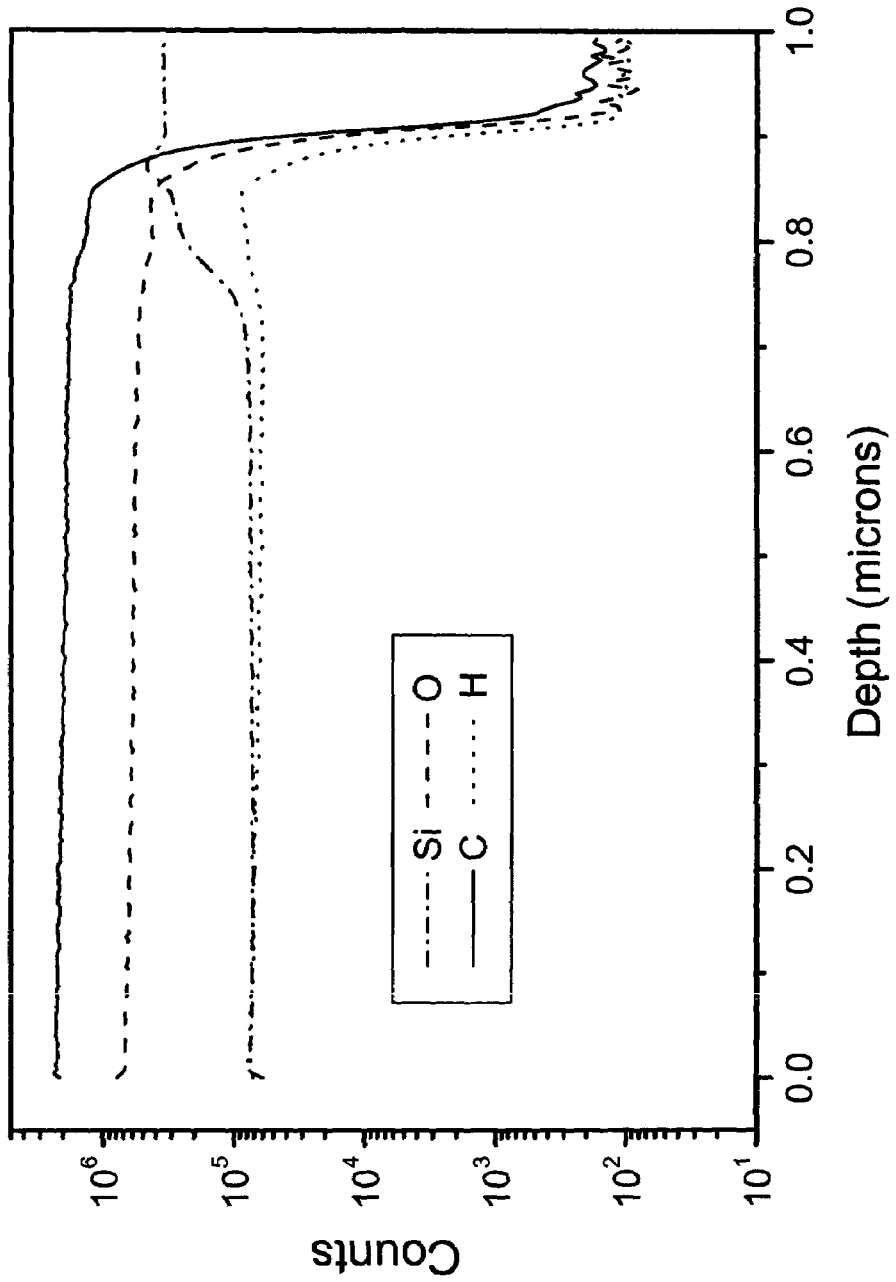
FIGS. 8a, 8b, and 8c provide the dynamic SIMS depth of profile measurements of silicon, oxygen, hydrogen, and carbon for a porous OSG film deposited using a DEMS structure-former precursor and an ATRP pore-former precursor after deposition and after exposure to UV light in a vacuum atmosphere for 1 minute and 15 minutes, respectively.
Figure 8B:
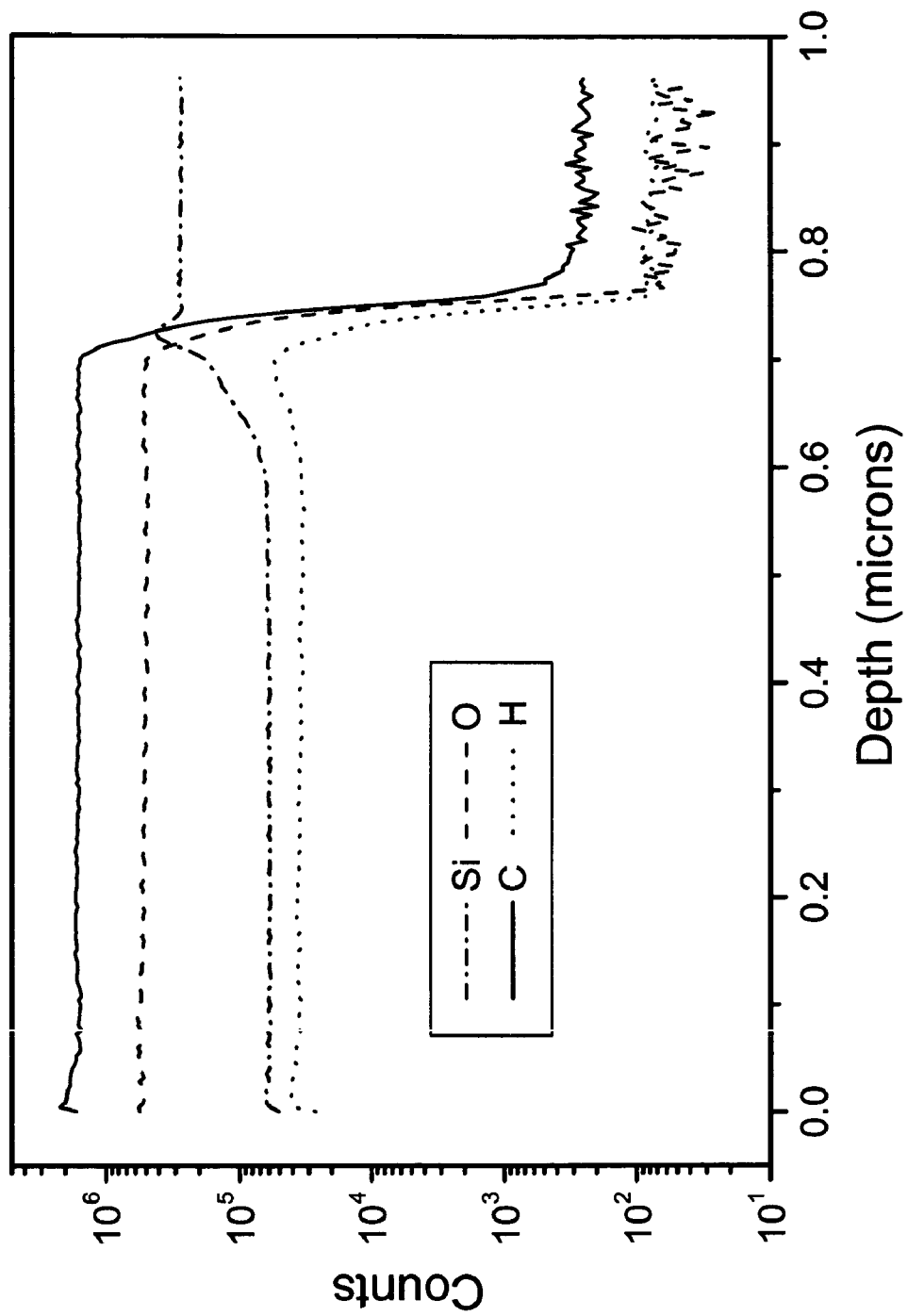
Figure 8C:
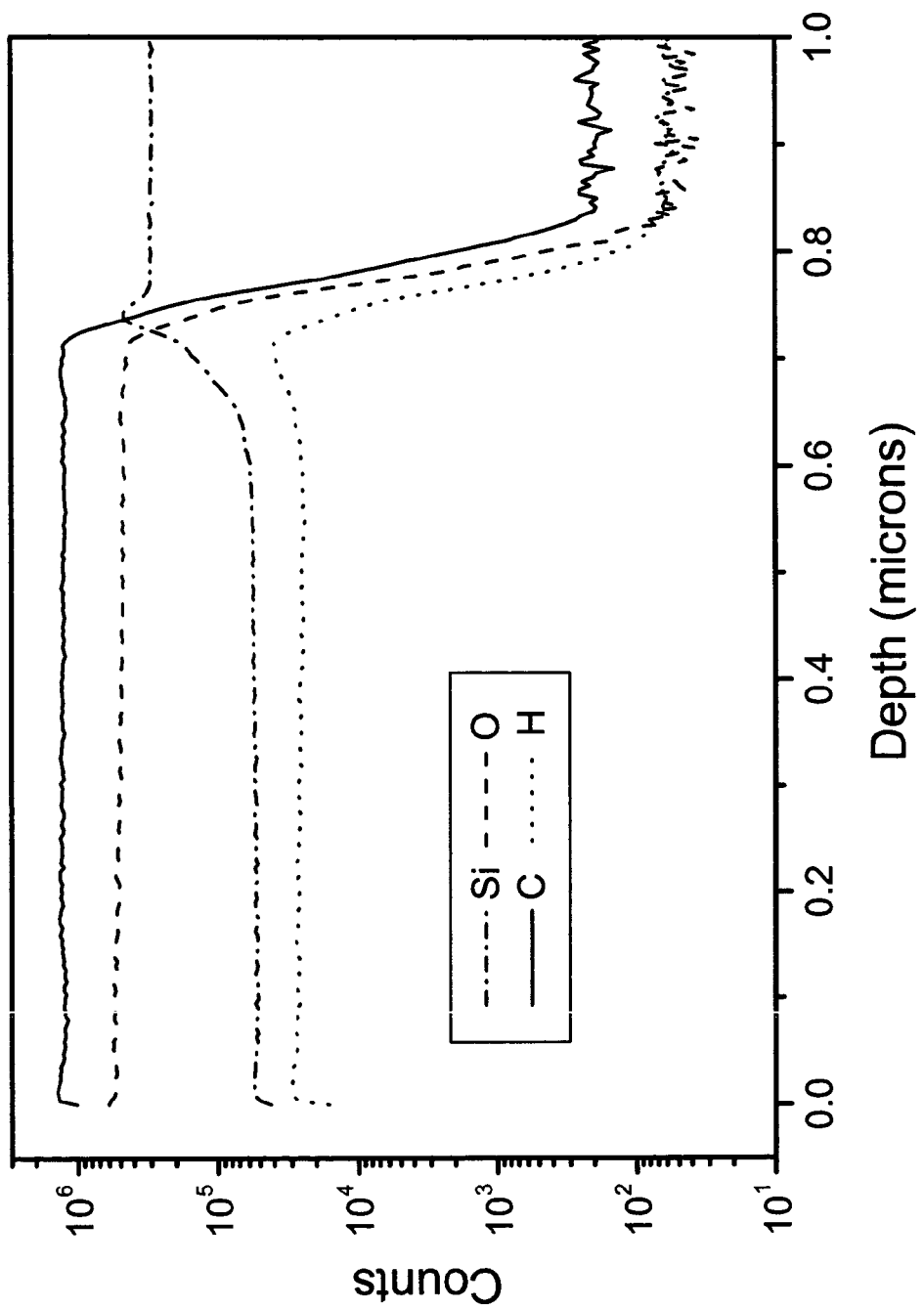

The dynamic SIMS data is provided in FIGS. 8a through 8c. The thickness of the as-deposited film, the film exposed to UV light for 1 minute, and the film exposed to UV light for 15 minutes was 1 micron, 980 nm, and 890 nm, respectively. The percentage of compositional non-uniformity for the OSG film after deposition, after exposure to UV light for 1 minute, and after exposure to UV light after 15 minutes is provided in FIGS. 8a through 8c. Table 5 shows that the percentage of compositional non-uniformity as calculated using the standard deviation for a variety of different SIMS measurements taken throughout each film.

As FIGS. 8a through 8c illustrate, the substantially flat profiles of the silicon, substantially uniform throughout the thickness of the film. The results show no significant deviation through the material. The upward spike in the data at the bottom of the film was attributable to interfacial effects.

TABLE 5

| | Percentage of Compositional Non-Uniformity | | | |
|---|---|---|---|---|
| | H (% Non-Uniformity) | C (% Non-Uniformity) | O (% Non-Uniformity) | Si (% Non-Uniformity) |
| As-deposited | 3.5064 | 3.2662 | 6.2764 | 1.6829 |
| After 1 min. UV | 1.1669 | 0.8641 | 1.2081 | 1.1438 |
| After 15 min. UV | 0.9569 | 0.7892 | 0.7610 | 1.0811 |

Example 11

Deposition of Octamethylcyclotetrasiloxane (OMCTS) Film

OSG films deposited from plasma enhanced chemical vapor deposition (PE-CVD) of octamethylcyclotetrasiloxane (OMCTS) were exposed to UV light for varying amounts of time. The dielectric constant of the film before UV treatment was nominally 3.0. The change in modulus and hardness of the film after UV exposure are provided in Table 6. The data shows that UV exposure of an OMCTS film deposited by PE-CVD improves material hardness by 83% from 0 to 30 minutes compared to that of the as-deposited film.

TABLE 6

| | Film properties after exposure to UV light for the time durations shown. | | | | |
|---|---|---|---|---|---|
| UV Exposure Time (minutes) | Thickness (nm) | Thickness Loss (%) | Dielectric Constant | Modulus (GPa) | Hardness (GPa) |
| 0 | 930 | — | 3.0 | 13.8 | 2.3 |
| 1 | 920 | −1 | N/A | 15.4 | 2.6 |
| 5 | 870 | −6.5 | N/A | 22.0 | 3.4 |
| 10 | 860 | −7.5 | N/A | 24.6 | 3.5 |
| 15 | 850 | −8.6 | N/A | 24.4 | 3.5 |
| 30 | 820 | −11.8 | N/A | 31.3 | 4.1 |

The present invention has been set forth with regard to several preferred embodiments, but the scope of the present invention is considered to be broader than those embodiments and should be ascertained from the claims below.

The invention claimed is:

1. A process for preparing a porous film, the process comprising the steps of:
    forming a composite film onto at least a portion of a substrate by a CVD process, wherein the composite film comprises at least one silicon-based structure-forming material and at least one pore-forming material, and wherein the composite film is substantially free of Si—OH bonds; and
    exposing the composite film to at least one ultraviolet light source within a non-oxidizing atmosphere for a time sufficient to remove at least a portion of the at least one pore-forming material contained therein and provide the porous film,
    wherein the silicon-based structure-forming material is formed from at least one gaseous linear organosilane or organosiloxane structure-former reagent selected from the group consisting of: diethoxymethylsilane, tetraethoxysilane, dimethyldiethoxysilane, dimethyldimethoxysilane, dimethylethoxysilane, methyldiethoxysilane, triethoxysilane, trimethylphenoxysilane, phenoxysilane, hexamethyldisiloxane, 1,1,2,2-tetramethyldisiloxane, and octamethyltrisiloxane,
    wherein the at least one pore-forming material is formed from at least one pore-former reagent wherein the pore-former reagent is a gaseous hydrocarbon having from 1 to 13 carbon atoms, and
    wherein the pore-former reagent is distinct from the at least one linear organosilane or organosiloxane structure-former reagent.

2. The process of claim 1 further comprising treating the composite film with at least one additional energy source selected from the group consisting of a thermal energy, α-particles, β-particles, γ-rays, x-rays, electron beam, ultraviolet light, visible light, infrared light, microwave, radio-frequency wavelengths, and combinations thereof.

3. The process of claim 2 wherein the energy source is thermal energy.

4. The process of claim 1 wherein the ultraviolet light is comprised of at least one selected from the group consisting of dispersed, focused, continuous, intermittent, and combinations thereof.

5. The process of claim 1 wherein the ultraviolet light has one or more wavelengths of about 340 nm or below.

6. The process of claim 5 wherein the ultraviolet light has one or more wavelengths of about 280 nm or below.

7. The process of claim 6 wherein the ultraviolet light has one or more wavelengths of about 200 nm or below.

8. The process of claim 1 wherein the ultraviolet light is provided by at least one selected from the group consisting of a barrier discharge lamp, a mercury lamp, a microwave-generated UV lamp, a laser, and combinations thereof.

9. The process of claim 8 wherein the ultraviolet light is provided by the laser and the laser is selected from the group consisting of: an eximer laser, a frequency doubled laser in the IR or visible region, and a frequency tripled laser in the IR or visible region.

10. The process of claim 1 wherein the exposing step is conducted by employing a quartz vessel, a deposition chamber, a conveyor belt process system, a vacuum chamber, a cluster tool, a single wafer instrument, a batch processing instrument, a rotating turnstile, and combinations thereof.

11. The process of claim 1 wherein the at least one structure-forming material is at least one selected from the group consisting of undoped silica glass ($SiO_2$), silicon carbide (SiC), hydrogenated silicon carbide (Si:C:H), silicon oxynitride (Si:O:N), silicon nitride (Si:N), silicon carbonitride (Si:C:N), fluorosilicate glass (Si:O:F), organofluorosilicate glass (Si:O:C:H:F), organosilicate glass (Si:O:C:H), diamond-like carbon, borosilicate glass (Si:O:B:H), phosphorous doped borosilicate glass (Si:O:B:H:P), and combinations thereof.

12. The process of claim 1 wherein the at least one structure-forming material is represented by the formula $Si_vO_wC_xH_yF_z$ where v+w+x+y+z=100 atomic %, v is from 10 to 35 atomic %, w is from 10 to 65 atomic %, x is from 5 to 30 atomic %, y is from 10 to 50 atomic %, and z is from 0 to 15 atomic %.

13. The process of claim 1 wherein the at least one pore-former reagent is selected from the group consisting of alpha-terpinene, limonene, cyclohexane, 1,2,4-trimethylcyclohexane, 1,5-dimethyl-1,5-cyclooctadiene, camphene, adamantane, 1,3-butadiene, decahydronaphthelene, gamma-terpinene, alpha-pinene, beta-pinene, norbornadiene, and combinations thereof.

14. The process of claim 13 wherein the at least one pore-former reagent is norbornadiene.

15. The process of claim 1 wherein the CVD process of the forming step is selected from the group consisting of: thermal chemical vapor deposition, plasma enhanced chemical vapor deposition, cryogenic chemical vapor deposition, chemical assisted vapor deposition, hot-filament chemical vapor deposition, and combinations thereof.

16. The process of claim 1 wherein the exposing step is conducted during at least a portion of the forming step.

17. The process of claim 1 wherein the pores within the porous film have an average size of about 100 nanometers or less.

18. The process of claim 17 wherein the average size of the pores within the porous film is about 10 nanometers or less.

19. The process of claim 18 wherein the average size of the pores within the porous film is about 2 nanometers or less.

20. The process of claim 1 wherein the time of the exposing step is one hour or less.

21. The process of claim 20 wherein the time of the exposing step is ten minutes or less.

22. The process of claim 21 wherein the time of the exposing step is ten seconds or less.

23. The process of claim 1 wherein the at least one energy source is less than 1000 feet from the material to be exposed.

24. The process of claim 23 wherein the at least one energy source is less than 10 feet from the material to be exposed.

25. The process of claim 24 wherein the at least one energy source is less than 1 foot from the material to be exposed.

26. The process of claim 1 wherein the non-oxidizing atmosphere contains at least one gas selected from the group consisting of nitrogen, hydrogen, inert gases, and combinations thereof.

27. The process of claim 1 wherein the non-oxidizing atmosphere comprises a vacuum.

28. A process for preparing a porous film, the process comprising:
    forming a composite film onto at least a portion of a substrate by a CVD process, wherein the composite film comprises at least one silicon-based structure-forming material and at least one pore-forming material, and wherein the composite film is substantially free of Si—OH bonds;
    exposing the composite film to at least one energy source comprising ultraviolet light within a non-oxidizing atmosphere for a time sufficient to remove at least a portion of the at least one pore-forming material contained therein to provide the porous film; and
    treating the porous film with one or more second energy sources,
    wherein the silicon-based structure-forming material is formed from at least one gaseous linear organosilane or organosiloxane structure-former reagent selected from the group consisting of: diethoxymethylsilane, tetraethoxysilane, dimethyldiethoxysilane, dimethyldimethoxysilane, dimethylethoxysilane, methyldiethoxysilane, triethoxysilane, trimethylphenoxysilane, phenoxysilane, hexamethyldisiloxane, 1,1,2,2-tetramethyldisiloxane, and octamethyltrisiloxane,
    wherein the at least one pore-forming material is formed from at least one pore-former reagent wherein the pore-former reagent is a gaseous hydrocarbon having from 1 to 13 carbon atoms, and
    wherein the pore-former reagent is distinct from the at least one linear organosilane or organosiloxane structure-former reagent.

29. The process of claim 28 wherein the second energy source is at least one selected from the group consisting of thermal energy, α-particles, β-particles, γ-rays, x-rays, electron beam, ultraviolet light, visible light, infrared light, microwave, radio-frequency wavelengths, and combinations thereof.

30. The process of claim 28 wherein the treating step is conducted after the exposing step.

31. The process of claim 28 wherein the dielectric constant of the porous film after the exposing step is 2.7 or less.

32. The process of claim 28 wherein the dielectric constant of the porous film after the exposing step is 2.4 or less.

33. The process of claim 28 wherein the dielectric constant of the porous film after the exposing step is 2.2 or less.

34. A process for preparing a porous film, the process comprising:
    forming a composite film onto at least a portion of a substrate by a CVD process, wherein the composite film comprises at least one silicon-based structure-forming material and at least one pore-forming material, and wherein the composite film is substantially free of Si—OH bonds; and
    exposing the composite film to an ultraviolet light source within a non-oxidizing atmosphere for a time sufficient to remove at least a portion of the at least one pore-forming material contained therein to provide the porous film wherein the density of the porous film is at least 10% less than the density of the composite film,
    wherein the silicon-based structure-forming material is formed from at least one gaseous linear organosilane or organosiloxane structure-former reagent selected from the group consisting of: diethoxymethylsilane, tetraethoxysilane, dimethyldiethoxysilane, dimethyldimethoxysilane, dimethylethoxysilane, methyldiethoxysilane, triethoxysilane, trimethylphenoxysilane, phenoxysilane, hexamethyldisiloxane, 1,1,2,2-tetramethyldisiloxane, and octamethyltrisiloxane, wherein the at least one pore-forming material is formed from at least one pore-former reagent wherein the pore-former reagent is a gaseous hydrocarbon having from 1 to 13 carbon atoms, and wherein the pore-former reagent is distinct from the at least one linear organosilane or organosiloxane structure-former reagent.

35. A process for preparing a porous film, the process comprising:

forming a composite film having a first density onto at least a portion of a substrate by a CVD process, wherein the composite film comprises at least one silica-based structure-forming material and at least one pore-forming material, and wherein the composite film is substantially free of Si—OH bonds; and exposing the composite film to an ultraviolet light source within a non-oxidizing atmosphere for a time sufficient to substantially remove the at least one pore-forming material contained therein to provide the porous film having a second density wherein the second density is at least 10 percent less than the first density, wherein the silicon-based structure-forming material is formed from at least one gaseous linear organosilane or organosiloxane structure-former reagent selected from the group consisting of: diethoxymethylsilane, tetraethoxysilane, dimethyldiethoxysilane, dimethyldimethoxysilane, dimethylethoxysilane, methyldiethoxysilane, triethoxysilane, trimethylphenoxysilane, phenoxysilane, hexamethyldisiloxane, 1,1,2,2-tetramethyldisiloxane, and octamethyltrisiloxane, wherein the at least one pore-forming material is formed from at least one pore-former reagent wherein the pore-former reagent is a gaseous hydrocarbon having from 1 to 13 carbon atoms, and wherein the pore-former reagent is distinct from the at least one linear organosilane or organosiloxane structure-former precursor.

36. The process of claim 35 wherein the second density is at least 25 percent less than the first density.

37. The process of claim 35 wherein the second density is at least 50 percent less than the first density.

38. The process of claim 35 wherein the porous film is substantially the same composition as the at least one structure-forming material.

39. A chemical vapor deposition method for producing a porous film represented by the formula $Si_vO_wC_xH_yF_z$, where $v+w+x+y+z=100$ atomic %, v is from 10 to 35 atomic %, w is from 10 to 65 atomic %, x is from 5 to 30 atomic %, y is from 10 to 50 atomic %, and z is from 0 to 15 atomic %, the method comprising:

providing a substrate within a vacuum chamber;

introducing into the vacuum chamber gaseous reagents including at least one structure-former reagent and pore-former reagent distinct from the at least one structure-former reagent, wherein the pore-former reagent is a hydrocarbon having from 1 to 13 carbon atoms;

applying energy to the gaseous reagents in the vacuum chamber to induce reaction of the reagents to deposit a composite film on the substrate, wherein the composite film comprises at least one structure-forming material and at least one pore-forming material, and wherein the composite film is substantially free of Si—OH bonds; and exposing the composite film to an ultraviolet light source within a non-oxidizing atmosphere for a time sufficient to substantially remove the at least one pore-forming material contained therein to provide the porous film comprising a plurality of pores and a dielectric constant of 2.7 or less, wherein the at least one structure-former reagent comprises at least one linear organosilane or organosiloxane selected from the group consisting of: diethoxymethylsilane, tetraethoxysilane, dimethyldiethoxysilane, dimethyldimethoxysilane, dimethylethoxysilane, methyldiethoxysilane, triethoxysilane, trimethylphenoxysilane, phenoxysilane, hexamethyldisiloxane, 1,1,2,2-tetramethyldisiloxane, and octamethyltrisiloxane.

40. The method of claim 39 wherein the pore-forming precursor is at least one member selected from the group consisting of alpha-terpinene, limonene, cyclohexane, 1,2,4-trimethylcyclohexane, 1,5-dimethyl-1,5-cyclooctadiene, camphene, adamantane, 1,3-butadiene, gamma-terpinene, alpha-pinene, beta-pinene, norbornadiene, and decahydronaphthelene.

* * * * *